(12) United States Patent
Kozawa et al.

(10) Patent No.: US 10,191,125 B2
(45) Date of Patent: Jan. 29, 2019

(54) SENSOR UNIT HAVING MAGNETIC SENSORS RESPECTIVELY INCLUDING PRIMARY AND SECONDARY OUTPUT TERMINALS, AND MAGNETIC COLLECTOR MODULE INCLUDING THE SAME

(71) Applicant: DENSO CORPORATION, Kariya, Aichi-pref. (JP)

(72) Inventors: Takaharu Kozawa, Kariya (JP); Hideki Kabune, Kariya (JP); Yoshiki Takahashi, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 86 days.

(21) Appl. No.: 14/973,364

(22) Filed: Dec. 17, 2015

(65) Prior Publication Data

US 2016/0178709 A1    Jun. 23, 2016

(30) Foreign Application Priority Data

Dec. 22, 2014   (JP) ................. 2014-258927

(51) Int. Cl.
*G01L 3/10*     (2006.01)
*G01R 33/00*    (2006.01)
*G01R 33/07*    (2006.01)

(52) U.S. Cl.
CPC .......... *G01R 33/0047* (2013.01); *G01L 3/101* (2013.01); *G01R 33/07* (2013.01)

(58) Field of Classification Search
CPC .... G01B 7/14; G01L 3/00; G01L 3/02; G01L 3/04; G01L 3/10; G01L 3/101; G01L 3/102; G01L 3/103; G01L 3/104; G01L 3/105; G01L 3/109; G01L 3/1435; G01L 5/00023; G01L 5/0042; G01R 33/06; G01R 33/07;

(Continued)

(56) References Cited

U.S. PATENT DOCUMENTS

2006/0006864 A1* 1/2006 Johnson ................. G01D 5/145
                                                    324/252
2008/0028870 A1* 2/2008 Tokumoto ............... G01L 5/221
                                                    73/862.333

(Continued)

OTHER PUBLICATIONS

U.S. Appl. No. 14/947,894, filed Nov. 20, 2015, Takahashi et al.
U.S. Appl. No. 14/948,061, filed Nov. 20, 2015, Takahashi et al.

*Primary Examiner* — David M. Schindler
(74) *Attorney, Agent, or Firm* — Knobbe, Martens, Olson & Bear, LLP

(57) ABSTRACT

A magnetic sensor of a sensor unit includes magnetic sensing elements, an encapsulating portion, a primary terminal group and a secondary terminal group. Another magnetic sensor includes magnetic sensing elements, an encapsulating portion, a primary terminal group and a secondary terminal group. The magnetic sensors are mounted on a common surface of a circuit board. The adjacent two magnetic sensors, which are oriented in a common direction, are arranged such that the secondary terminal group of one of the adjacent two magnetic sensors is opposed to the primary terminal group of the other one of the adjacent two magnetic sensors. A primary output terminal and a secondary output terminal are placed asymmetrically to each other with respect to a center line of the encapsulating portion.

8 Claims, 15 Drawing Sheets

(58) Field of Classification Search
CPC .. G01R 33/072; G01R 33/075; G01R 33/077; G01R 33/09; G01R 33/091; G01R 33/093; G01R 33/095; G01R 33/096; G01R 33/098; G01R 33/0047; G01R 33/0011; G01D 5/142; G01D 5/145
See application file for complete search history.

(56) References Cited

U.S. PATENT DOCUMENTS

| | | | |
|---|---|---|---|
| 2010/0207621 A1* | 8/2010 | Yano | G01R 33/072 324/247 |
| 2011/0221432 A1 | 9/2011 | Oota | |
| 2012/0194175 A1* | 8/2012 | Ausserlechner | G01D 5/2451 324/207.14 |
| 2013/0021025 A1* | 1/2013 | Krishnaiah | G01B 7/30 324/207.25 |
| 2013/0152702 A1 | 6/2013 | Takahashi et al. | |
| 2013/0334634 A1* | 12/2013 | Deak | G01B 7/30 257/427 |
| 2014/0130612 A1 | 5/2014 | Takahashi et al. | |
| 2016/0153849 A1* | 6/2016 | Takahashi | B62D 6/10 73/862.325 |
| 2016/0153850 A1* | 6/2016 | Takahashi | G01R 33/07 73/862.325 |

* cited by examiner

SENSOR UNIT HAVING MAGNETIC SENSORS RESPECTIVELY INCLUDING PRIMARY AND SECONDARY OUTPUT TERMINALS, AND MAGNETIC COLLECTOR MODULE INCLUDING THE SAME

CROSS REFERENCE TO RELATED APPLICATION

This application is based on and incorporates herein by reference Japanese Patent Application No. 2014-258927 filed on Dec. 22, 2014.

TECHNICAL FIELD

The present disclosure relates to a sensor unit and a magnetic collector module including the same.

BACKGROUND

There is known a sensor unit, which includes a Hall IC having sensing elements for sensing a magnetic flux. For example, JP5067676B2 (corresponding to US 2011/0221432 A1) discloses a sensor unit that has two Hall ICs. One of the Hall ICs is placed at a front surface of a circuit board of the sensor unit, and the other one of the Hall ICs is placed at a rear surface of the circuit board.

In JP5067676B2 (corresponding to US 2011/0221432 A1), since the Hall ICs are mounted to the front and rear surfaces, respectively, of the circuit board, a reflow process needs to be performed twice.

In a case where two ICs, such as small outline package (SOP) type ICs, each of which has terminals at each of two sides of the IC, are placed adjacent to each other on a common surface of a circuit board, there will be a possibility of pin-to-pin short circuit between the ICs.

SUMMARY

The present disclosure is made in view of the above point.

According to the present disclosure, there is provided a sensor unit that includes a plurality of magnetic sensors and a circuit board. Each of the plurality of magnetic sensors includes a magnetic sensing element, an encapsulating portion, a primary terminal group, and a secondary terminal group. The magnetic sensing element senses a magnetic field. The encapsulating portion encapsulates the magnetic sensing element. The primary terminal group includes a plurality of terminals that project from a primary terminal forming part of the encapsulating portion. The primary terminal forming part is one side of the encapsulating portion. The secondary terminal group includes a plurality of terminals that project from a secondary terminal forming part of the encapsulating portion. The secondary terminal forming part is an opposite side of the encapsulating portion, which is opposite from the primary terminal forming part of the encapsulating portion. The circuit board has a common surface, to which the plurality of magnetic sensors is mounted. Adjacent two of the plurality of magnetic sensors, which are oriented in a common direction and are arranged side by side, are arranged such that the secondary terminal group of one of the adjacent two of the plurality of magnetic sensors is opposed to the primary terminal group of the other one of the adjacent two of the plurality of magnetic sensors. The plurality of terminals of the primary terminal group of each of the plurality of magnetic sensors includes a primary output terminal for outputting an output signal generated based on a measurement value of the magnetic sensing element of the magnetic sensor. The plurality of terminals of the secondary terminal group of each of the plurality of magnetic sensors includes a secondary output terminal for outputting the output signal. The primary output terminal and the secondary output terminal are placed asymmetrically to each other with respect to a center line centered between the primary terminal forming part and the secondary terminal forming part in each of the plurality of magnetic sensors.

According to the present disclosure, there is also provided a magnetic collector module that includes the sensor unit, a pair of magnetic collecting rings, a shield member, and a holding member. Each of the pair of magnetic collecting rings includes one or more magnetic collecting portions. Each of the plurality of magnetic sensors is held between a corresponding one of the one or more magnetic collecting portions of one of the pair of magnetic collecting rings and a corresponding one of the one or more magnetic collecting portions of the other one of the pair of magnetic collecting rings. The shield member shields magnetism applied from an outside. The holding member holds the pair of magnetic collecting rings and the sensor unit.

BRIEF DESCRIPTION OF THE DRAWINGS

The drawings described herein are for illustration purposes only and are not intended to limit the scope of the present disclosure in any way.

DETAILED DESCRIPTION

A sensor unit and a magnetic flux collecting module using the same according to the present disclosure will be described with reference to the accompanying drawings.

FIGS. 1 to 13 show a sensor unit and a magnetic flux collecting module using the same according to the embodiment of the present disclosure.

Figure 1:
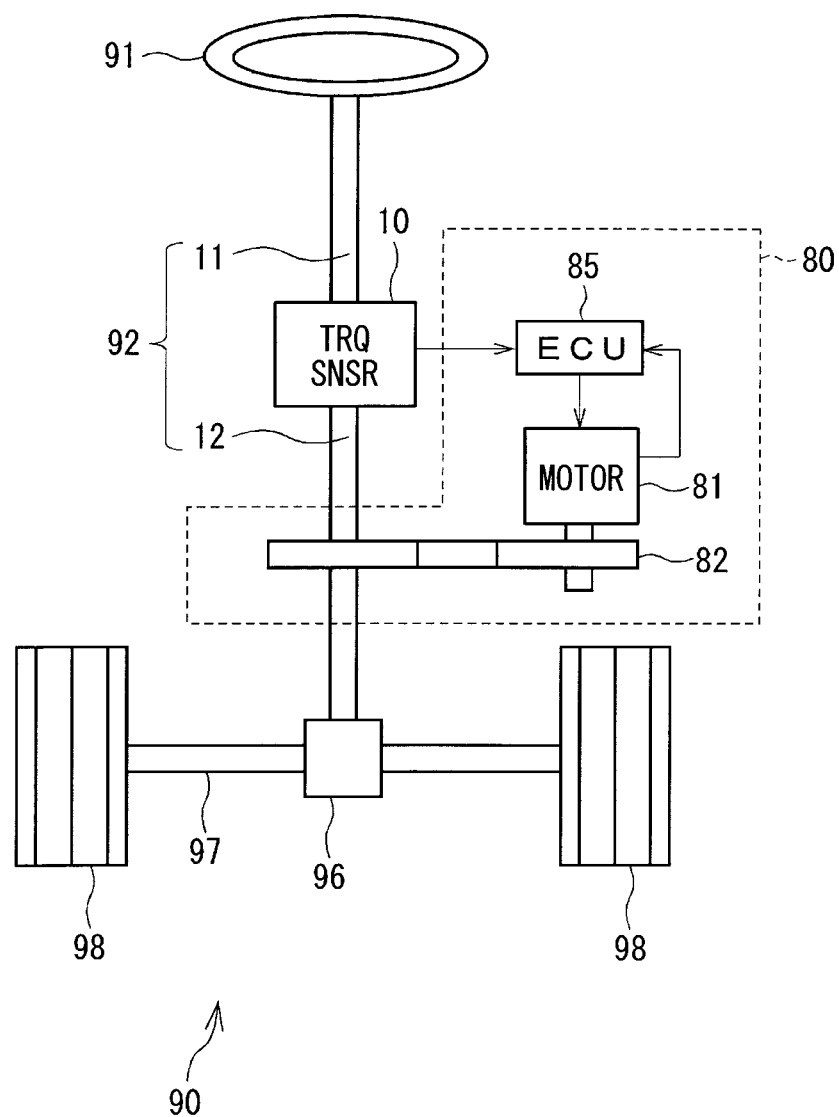
FIG. 1 is a schematic diagram showing a structure of an electric power steering apparatus according to an embodiment of the present disclosure.

As shown in FIG. 1, a torque sensor 10, which uses the magnetic flux collecting module (see FIG. 4), is applied to an electric power steering apparatus 80 that assists a steering operation of a driver of a vehicle for steering a steering wheel of the vehicle.

FIG. 1 shows an entire structure of a steering system 90, which includes the electric power steering apparatus 80. A steering wheel 91 is connected to a steering shaft 92.

The steering shaft 92 includes an input shaft 11, which serves as a first shaft, and an output shaft 12, which serves as a second shaft. The input shaft 11 is connected to the steering wheel 91. The torque sensor 10, which senses a torque applied to the steering shaft 92, is disposed between the input shaft 11 and the output shaft 12. A pinion gear 96 is installed at an end part of the output shaft 12, which is opposite from the input shaft 11. The pinion gear 96 is meshed with a rack shaft 97. Two drive wheels 98 are rotatably connected to two opposed end portions, respectively, of the rack shaft 97 through, for example, a tie rod.

Accordingly, when a driver of the vehicle rotates the steering wheel 91, the steering shaft 92, which is connected to the steering wheel 91, is rotated. The rotation of the steering shaft 92 is converted into linear motion of the rack shaft 97 by the pinion gear 96, so that the wheels 98 are steered to an angle, which corresponds to the amount of displacement of the rack shaft 97.

The electric power steering apparatus 80 includes an electric motor 81, a speed reducing gear 82, and a control device (hereinafter referred to as ECU) 85. In FIG. 1, the motor 81 and the ECU 85 are separated from each other. Alternatively, the motor 81 and the ECU 85 may be integrally formed.

The speed reducing gear 82 reduces a rotational speed of rotation transmitted from the motor 81 and outputs the rotation of the reduced rotational speed to the steering shaft 92. That is, the electric power steering apparatus 80 of the present embodiment is known as a column assist power steering apparatus. Alternatively, the electric power steering apparatus 80 may be formed as a rack assist power steering apparatus, which transmits the rotation of the motor 81 to the rack shaft 97.

The ECU 85 receives an output signal, which is outputted from the sensor unit 40. The ECU 85 drives the motor 81 based on a wheel steering torque, which is computed based on the output signal. The ECU 85 senses an abnormality of the sensor unit 40 based on the output signal. Details of the ECU 85 will be described later.

Figure 2:
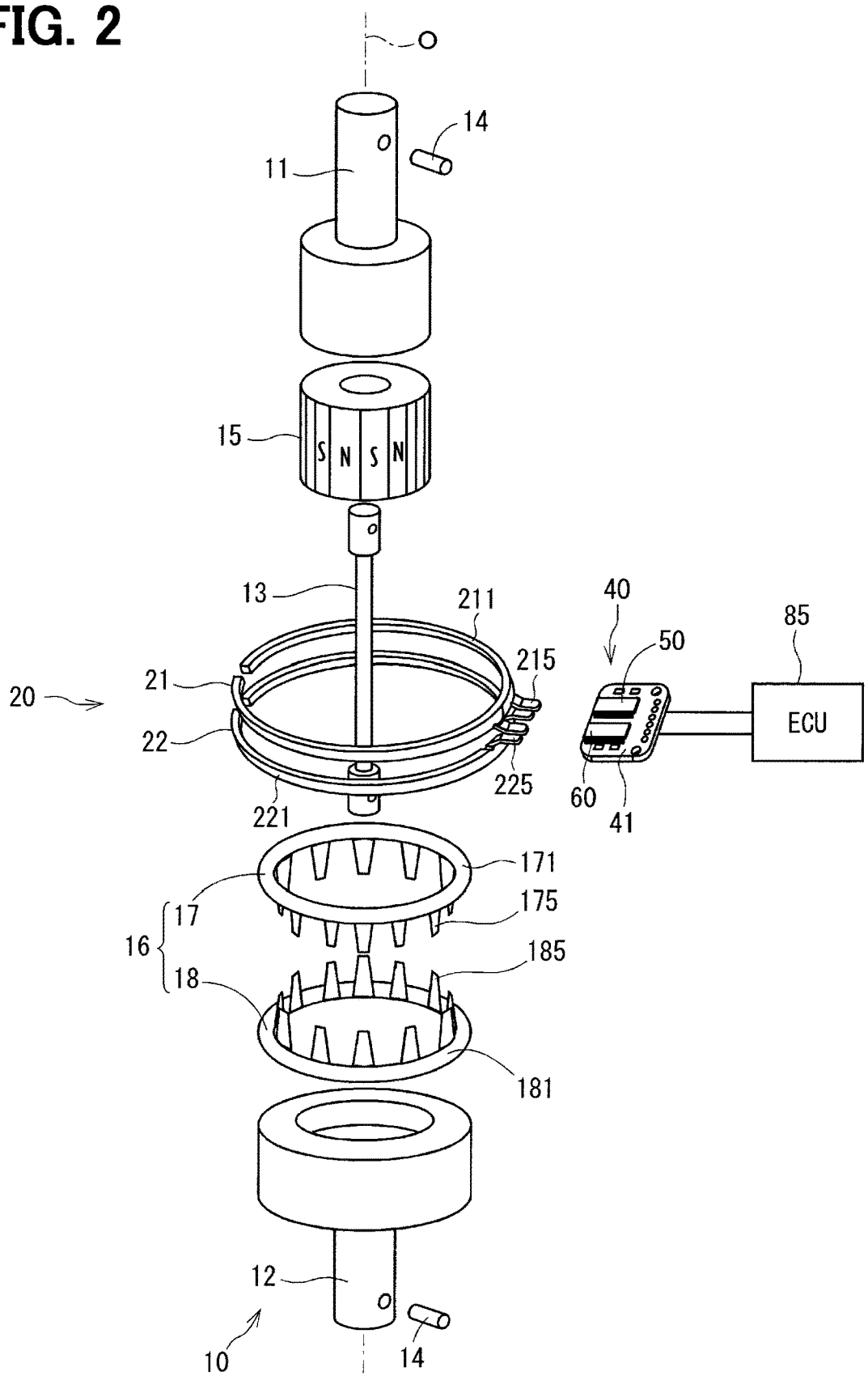
FIG. 2 is an exploded perspective view of a torque sensor according to the embodiment of the present disclosure.
Figure 3:
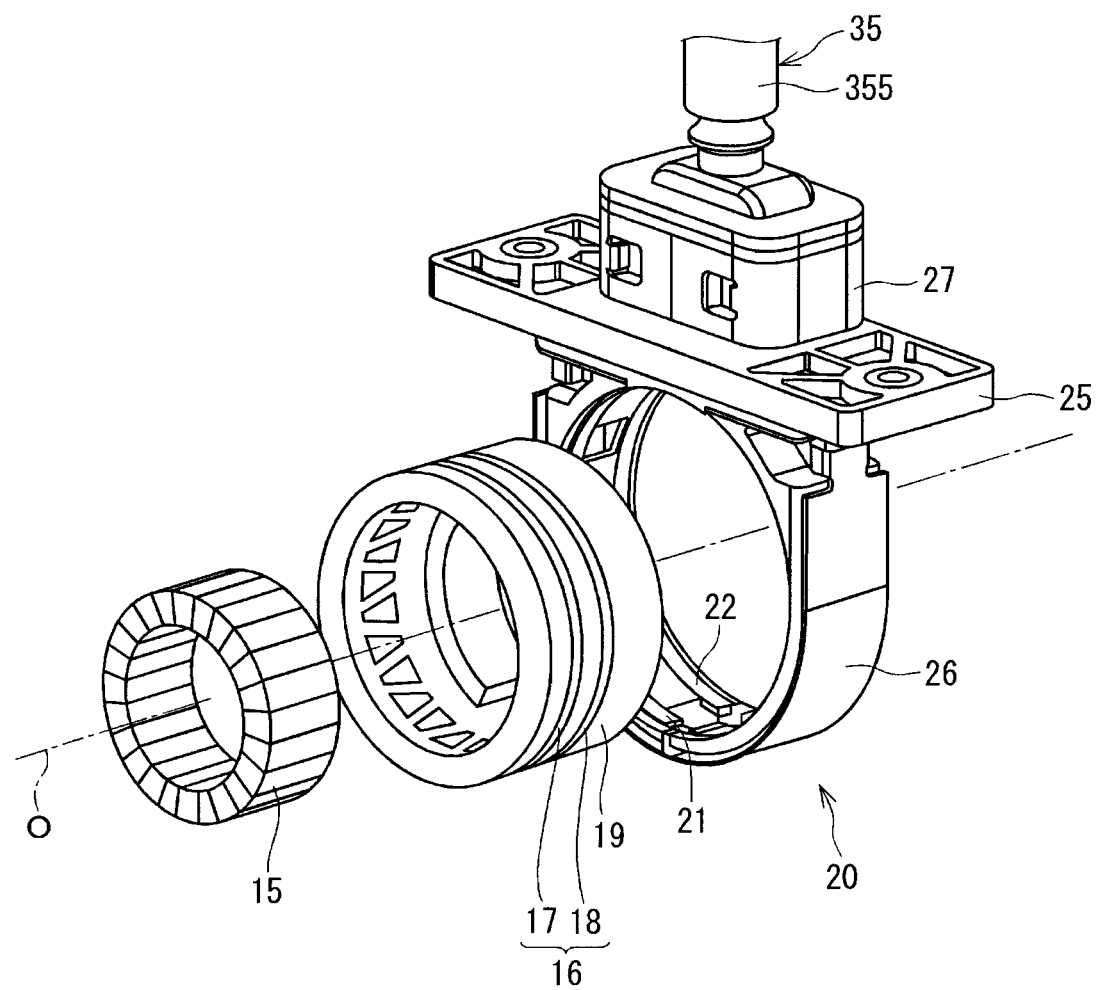
FIG. 3 is an exploded perspective view for describing a positional relationship among a multipole magnet, a magnetic yoke and a magnetic collector module according to an embodiment of the present disclosure.
Figure 4:
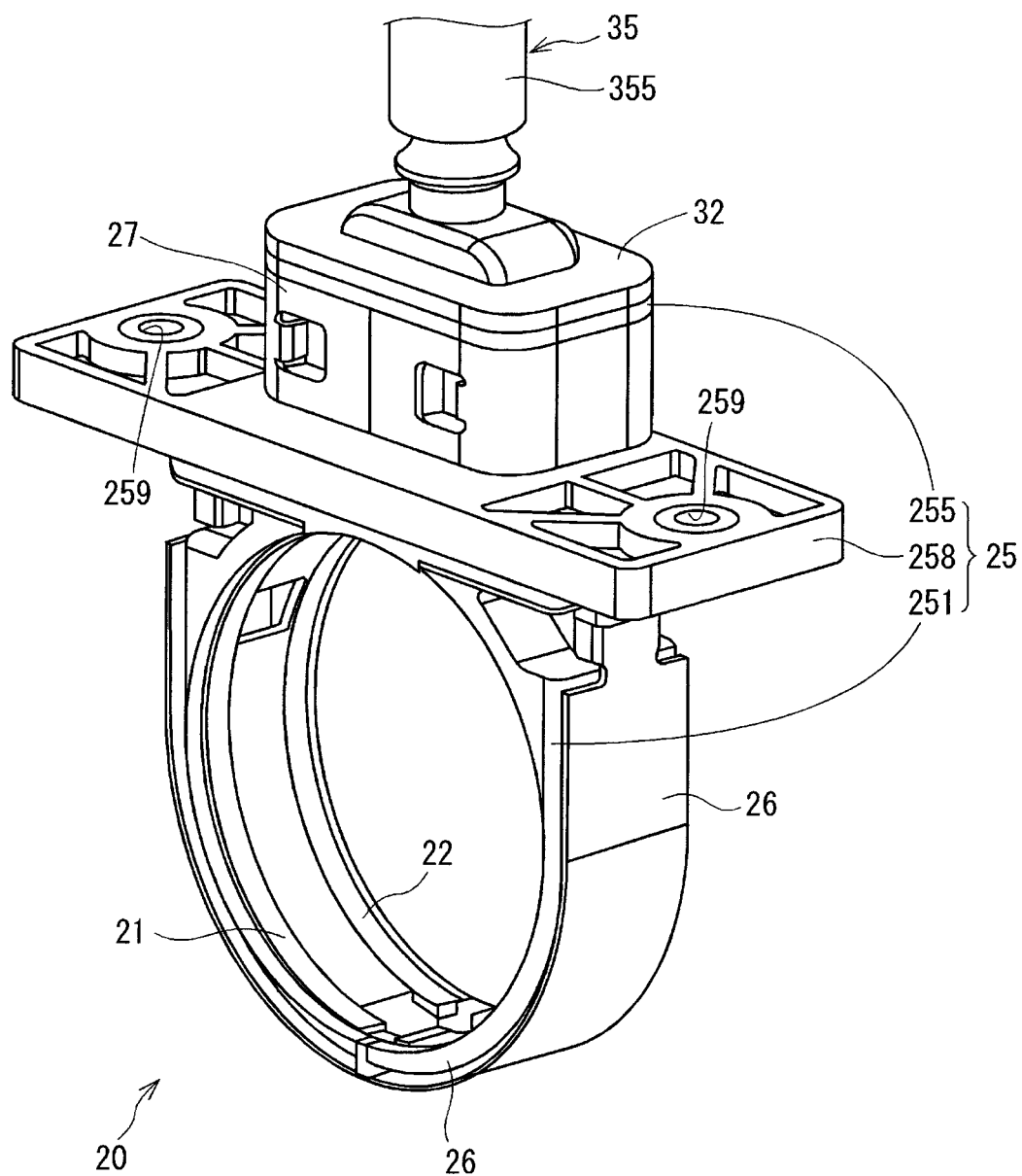
FIG. 4 is a perspective view of the magnetic collector module according to the embodiment of the present disclosure.
Figure 5:
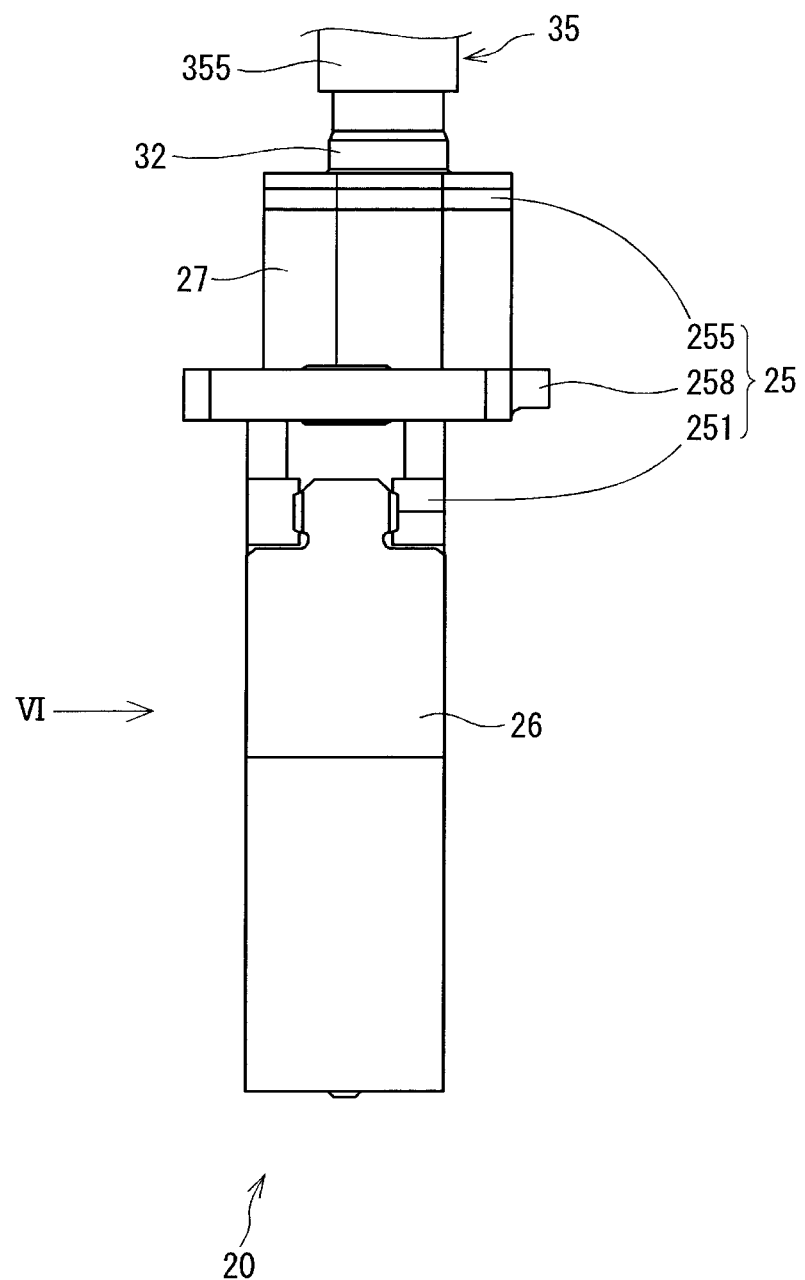
FIG. 5 is a side view of the magnetic collector module according to the embodiment of the present disclosure.
Figure 6:
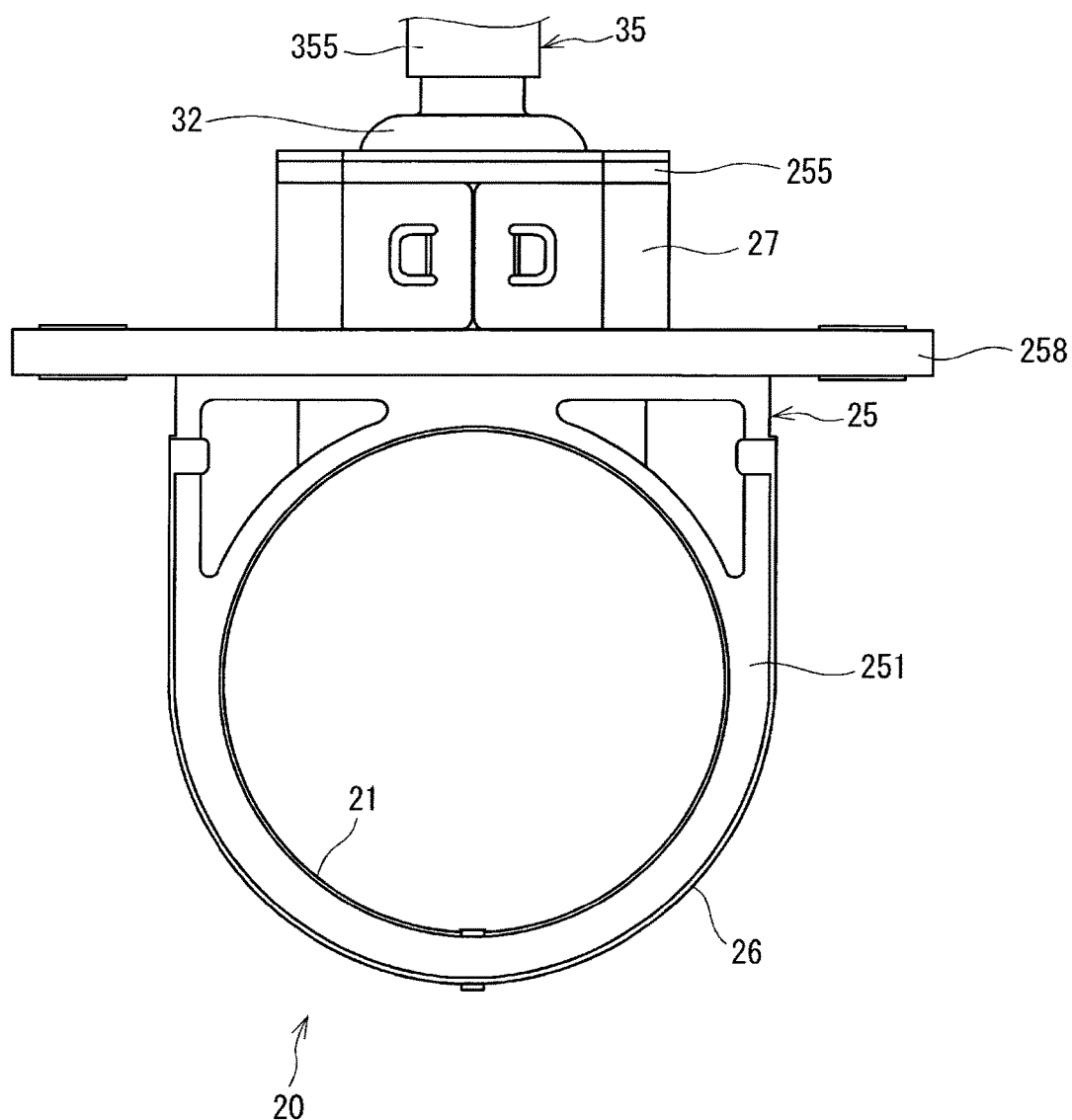
FIG. 6 is a view taken in a direction of an arrow VI in FIG. 5.
Figure 7:
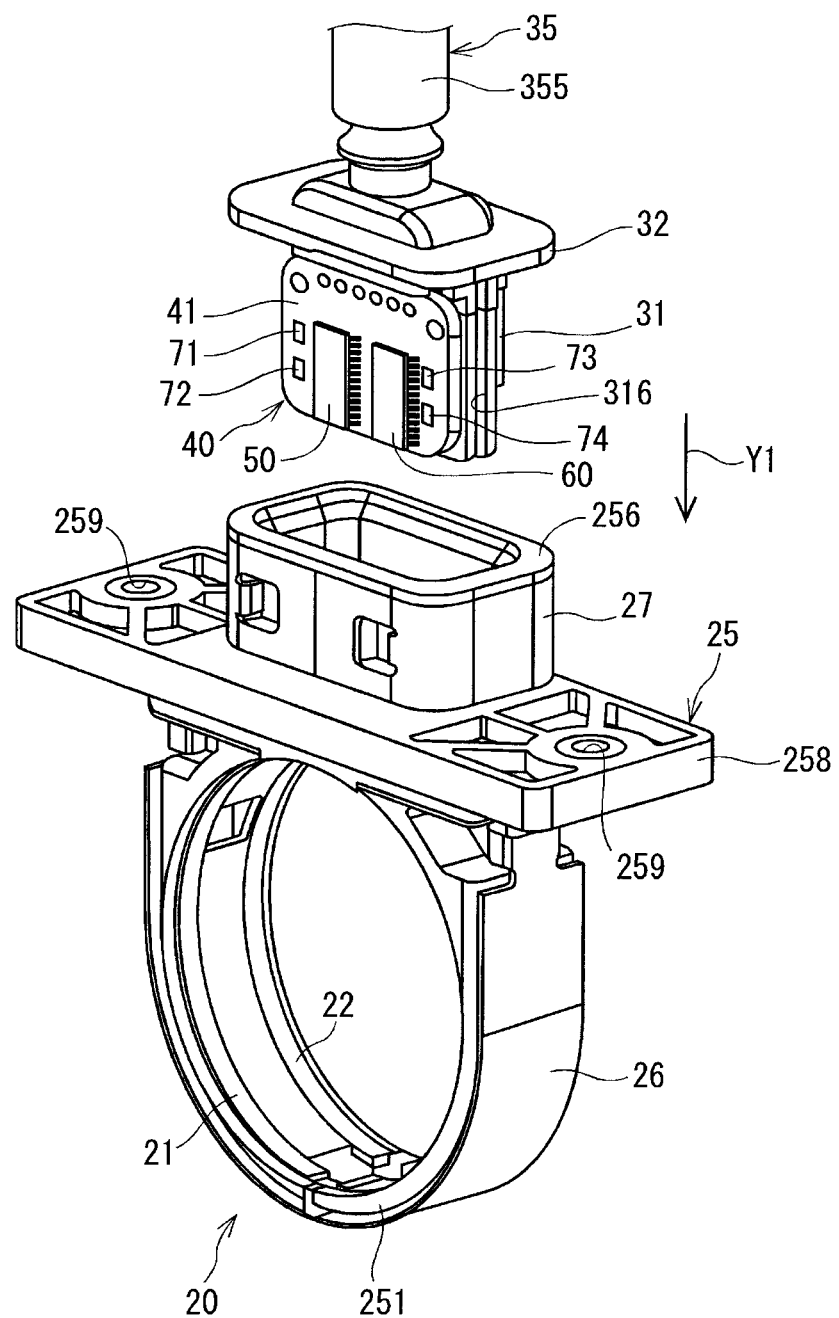
FIG. 7 is an exploded perspective view of the magnetic collector module according to the embodiment of the present disclosure.

As shown in FIGS. 2 and 3, the torque sensor 10 includes the input shaft 11, the output shaft 12, a torsion bar 13, a multipole magnet 15, a magnetic yoke 16 and a magnetic collector module 20. In FIG. 2, a yoke holding member 19, a magnetic collecting ring holding member 25, and a circuit board holding member 31, which will be described later, are omitted for the sale of simplicity.

One end of the torsion bar 13 is fixed to the input shaft 11 with a pin 14, and the other end of the torsion bar 13 is fixed to the output shaft 12 with another pin 14. The torsion bar 13 connects between the input shaft 11 and the output shaft 12 such that the input shaft 11, the torsion bar 13 and the output shaft 12 are coaxially placed along a rotational axis O. The torsion bar 13 is a resilient member, which is configured into a rod form. The torsion bar 13 converts the steering torque, which is applied to the steering shaft 92, into torsional displacement in the torsion bar 13.

The multipole magnet 15 is configured into a cylindrical tubular form and is fixed to the input shaft 11. The multipole magnet 15 is magnetized to have a plurality of N-poles and a plurality of S-poles, which are alternately arranged one after another in the circumferential direction. In the present embodiment, the total number of the N-poles is twelve, and the total number of the S-poles is twelve. Thereby, the total number of all of the magnetic poles of the multipole magnet 15 is twenty four in the present embodiment. However, the total number of the magnetic poles is not limited to this number and may be changed to any suitable number.

The magnetic yoke 16 is held by the yoke holding member 19, which is made of a non-magnetic material, such as resin. The magnetic yoke 16 forms a magnetic circuit in a magnetic field generated from the multipole magnet 15. In the present embodiment, the magnetic yoke 16 is insert molded into the yoke holding member 19.

The magnetic yoke 16 includes a first yoke 17 and a second yoke 18. The first yoke 17 is placed at the input shaft 11 side, and the second yoke 18 is placed at the output shaft 12 side. Each of the first yoke 17 and the second yoke 18 are made of a soft magnetic material and is configured into a ring form. The first yoke 17 and the second yoke 18 are placed on a radially outer side of the multipole magnet 15 and are fixed to the output shaft 12.

The first yoke 17 includes a ring portion 171 and teeth 175. The teeth 175 are placed one after another at equal intervals along an entire inner peripheral edge of the ring portion 171. The second yoke 18 includes a ring portion 181 and teeth 185. The teeth 185 are placed one after another at equal intervals along an entire inner peripheral edge of the ring portion 181.

The total number of the teeth 175, 185 is equal to the total number of pole pairs of the multipole magnet 15 (twelve in the present embodiment). The teeth 175 and the teeth 185 are alternately arranged one after another in the circumferential direction, and the first yoke 17 and the second yoke 18 are opposed to each other while an air gap is interposed between the first yoke 17 and the second yoke 18.

In a state where a torsional displacement is not generated in the torsion bar 13, i.e., in a state where the steering torque is not applied to the steering shaft 92, a center of each of the teeth 175, 185 coincides with a boundary between a corresponding one of the N poles and a corresponding one of the S poles of the multipole magnet 15.

As shown in FIGS. 3 to 7, the magnetic collector module 20 includes a pair of magnetic collecting rings (hereinafter referred to as first and second magnetic collecting rings) 21, 22, the magnetic collecting ring holding member 25, shield members 26, 27, the circuit board holding member 31 and the sensor unit 40.

The magnetic collecting rings 21, 22 are located on a radially outer side of the magnetic yoke 16 and collect a magnetic flux from the magnetic yoke 16. The first magnetic collecting ring 21 is placed at the input shaft 11 side, and the second magnetic collecting ring 22 is placed at the output shaft 12 side. The first magnetic collecting ring 21 and the second magnetic collecting ring 22 are held by the magnetic collecting ring holding member 25 by, for example, insert molding of the first and second magnetic collecting rings 21, 22 into the magnetic collecting ring holding member 25.

The first magnetic collecting ring 21 is made of a soft magnetic material and includes a ring portion 211 and two magnetic collecting portions 215. The ring portion 211 is configured generally into a ring form (more specifically a C-form). The magnetic collecting portions 215 radially outwardly project from the ring portion 211. Similar to the first magnetic collecting ring 21, the second magnetic collecting ring 22 is made of a soft magnetic material and includes a ring portion 221 and two magnetic collecting portions 225. The ring portion 221 is configured generally into a ring form (more specifically a C-form). The magnetic collecting portions 225 radially outwardly project from the ring portion 221. In the present embodiment, the first magnetic collecting ring 21 and the second magnetic collecting ring 22 are substantially identically configured.

An opposing surface of one of the magnetic collecting portions 215 of the first magnetic collecting ring 21 is opposed to and is generally parallel to an opposing surface of one of the magnetic collecting portions 225 of the second magnetic collecting ring 22, and an opposing surface of the other one of the magnetic collecting portions 215 of the first magnetic collecting ring 21 is opposed to and is generally parallel to an opposing surface of the other one of the magnetic collecting portions 225 of the second magnetic collecting ring 22. Each of magnetic sensors (specifically, a main magnetic sensor and a sub magnetic sensor) 50, 60, which will be described later, are placed between the corresponding opposed two of the magnetic collecting portions 215, 225.

The magnetic collecting ring holding member 25 is made of a non-magnetic material, such as resin. The magnetic collecting ring holding member 25 includes a ring holding portion 251, a sensor unit receiving portion 255 and a mounting portion 258, which are formed integrally.

The ring holding portion 251 is generally configured into a ring form (annular form). The ring portions 211, 221 are embedded at the rally inner side of the ring holding portion 251 such that a predetermined gap is formed between the one of the magnetic collecting portions 215 and the one of the magnetic collecting portions 225, which are opposed to each other, and a predetermined gap is formed between the other of the magnetic collecting portions 215 and the other one of the magnetic collecting portions 225. At this time, at least the opposing surfaces of the magnetic collecting portions 215, 225 are exposed from the magnetic collecting ring holding member 25.

The sensor unit receiving portion 255 is placed on a side of the ring holding portion 251 where the magnetic collecting portions 215, 225 are located. Furthermore, the sensor unit receiving portion 255 has an opening 256, which opens on a side opposite from the ring holding portion 251. The opening 256 is directed outwardly in the radial direction of the magnetic collecting rings 21, 22. As indicated by an arrow Y1 in FIG. 7, the circuit board holding member 31, to which the sensor unit 40 and an electric wire member 35 are fixed, is inserted into the opening 256.

The mounting portion 258 is located between the ring holding portion 251 and the sensor unit receiving portion 255. The mounting portion 258 extends in a direction of a tangent line that is tangent to an arc of the ring portions 211, 221 of the magnetic collecting rings 21, 22. Holes 259 are formed in the mounting portion 258. Screws (not shown) are inserted into the holes 259 to fix the magnetic collector module 20 to another member, such as a housing.

The shield member 26 is placed on a radially outer side of the ring holding portion 251. The shield member 27 is placed at an outer peripheral part of the sensor unit receiving portion 255. The shield members 26, 27 shield the magnetism applied from the outside.

Figure 9:
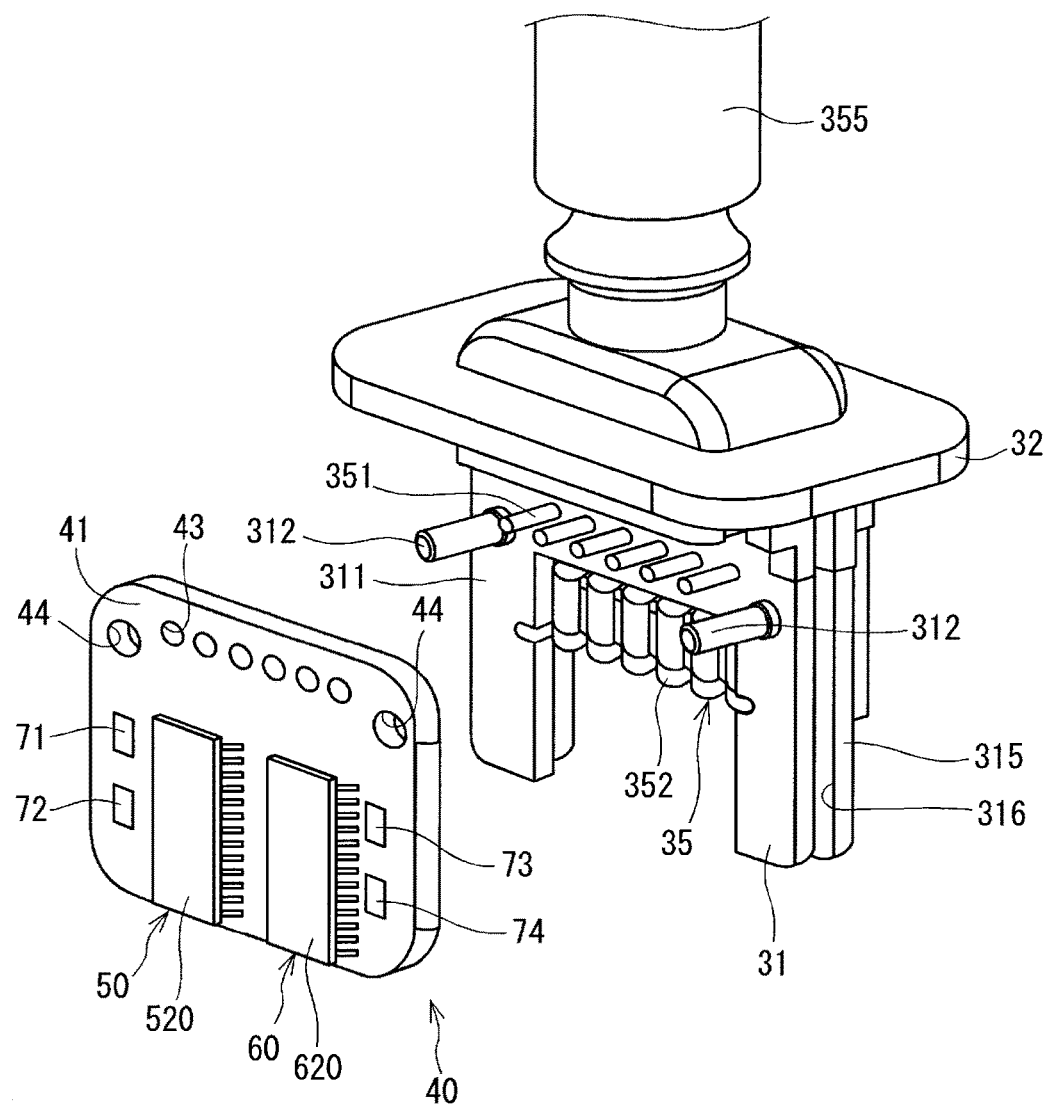
FIG. 9 is an exploded perspective view showing the sensor unit and a circuit board holding member according to the embodiment of the present disclosure.

The circuit board holding member 31 is made of a non-magnetic material, such as the resin. As shown in FIG. 9, projections 312 are formed in a circuit board fixing surface 311 of the circuit board holding member 31, to which the circuit board 41 is fixed. A positioning groove 316 is formed in a side surface 315 of the circuit board holding member 31. A rib (not shown), which is formed in the sensor unit receiving portion 255, is inserted into the positioning groove 316. In this way, the circuit board holding member 31 is positioned relative to the magnetic collecting ring holding member 25. Alternatively, the groove may be formed in the magnetic collecting ring holding member 25, and the rib may be formed in the circuit board holding member 31.

A cover member 32 is made of a non-magnetic material, such as resin, and is configured to cover the opening of the sensor unit receiving portion 255. The cover member 32 is fixed to the circuit board holding member 31 through, for example, fitting of the cover member 32 to the circuit board holding member 31. The electric wire member 35 extends from the cover member 32.

The electric wire member 35 includes circuit board connecting portions 351, intermediate portions 352, and an assembly portion 355. Each of the circuit board connecting portions 351 is inserted into a corresponding one of wire receiving holes 43 of the circuit board 41 (see FIGS. 10 and 11). The intermediate portions 352 are provided to correspond with the circuit board connecting portions 351, respectively. The assembly portion 355 projects from the cover member 32 to an outside of the magnetic collector module 20. An opposite end portion of the electric wire member 35, which is opposite from the circuit board connecting portions 351, is connected to the ECU 85.

Figure 10:
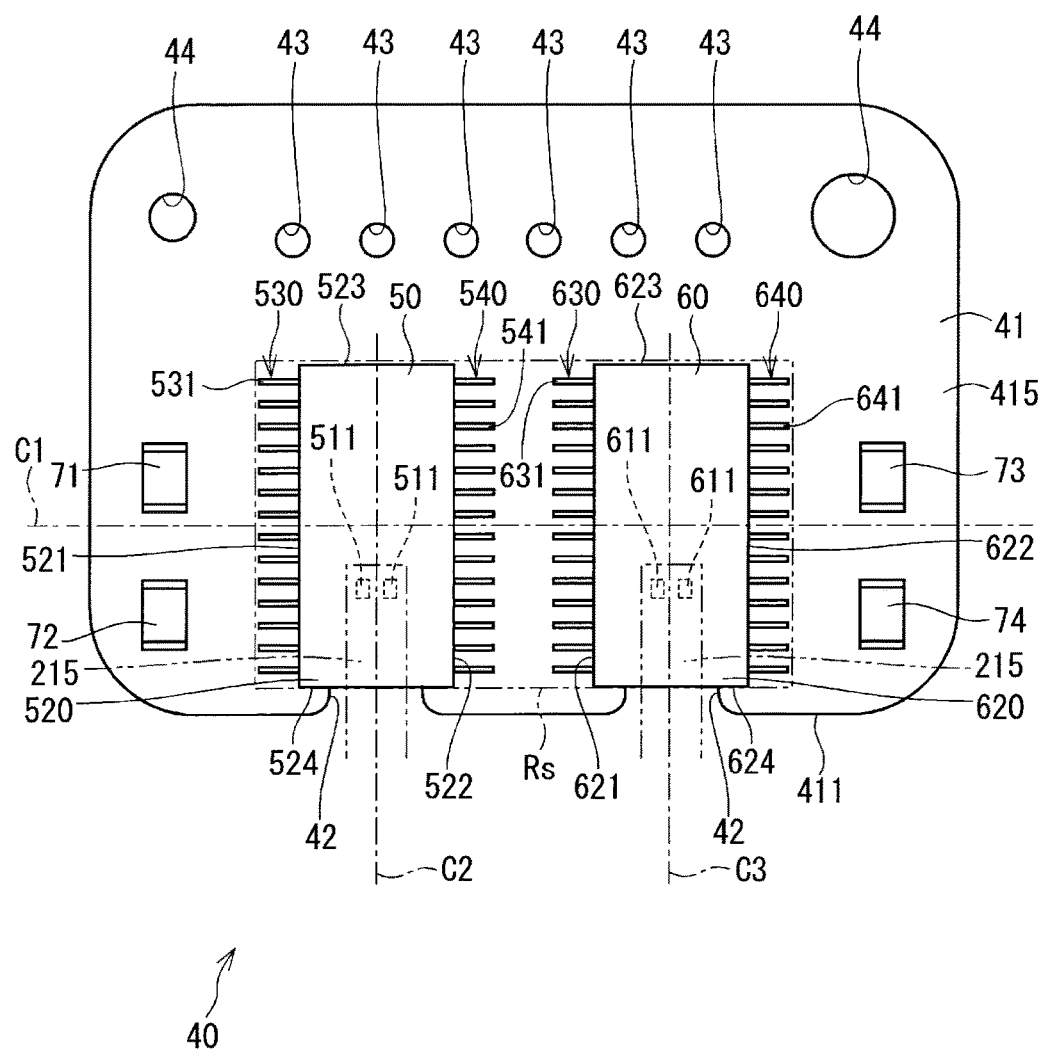
FIG. 10 is a plan view showing a side of the sensor unit, to which magnetic sensors of the present embodiment are mounted.
Figure 11:
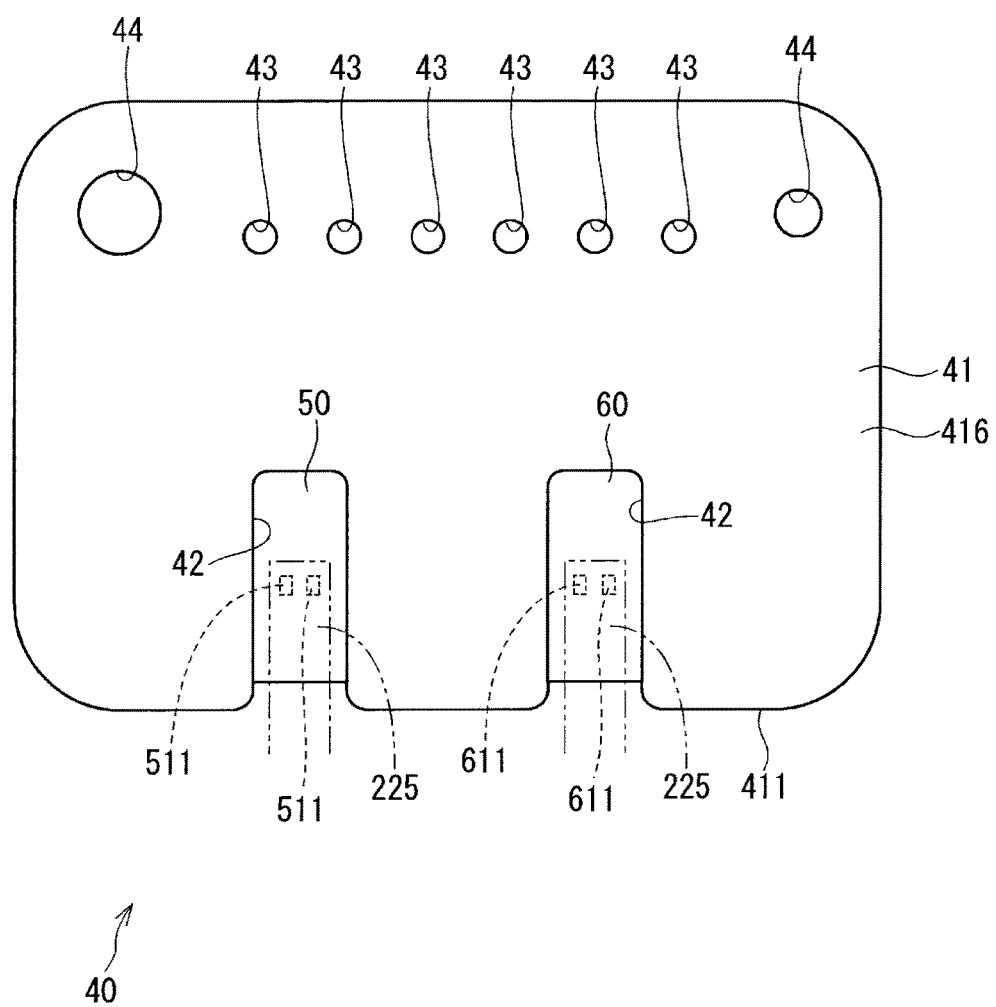
FIG. 11 is a plan view showing an opposite side of the sensor unit, to which the magnetic sensors are not mounted, according to the embodiment of the present disclosure.

As shown in FIGS. 10 and 11, the sensor unit 40 includes the circuit board 41, the magnetic sensors 50, 60 and capacitors 71-74.

The circuit board 41 is configured into a generally rectangular plate form and has cutouts 42, the wire receiving holes 43 and fixing holes 44.

The cutouts 42 open at one end 411 of the circuit board 41, which serves as a leading end of the circuit board 41 at the time of inserting the circuit board 41 into the magnetic collecting ring holding member 25. The total number of the cutouts 42 corresponds to the total number of the magnetic sensors 50, 60. In the present embodiment, the total number of the cutouts 42 is two.

The circuit board connecting portions 351 of the electric wire member 35 are inserted into the wire receiving holes 43 and are electrically connected to the wire receiving holes 43 by, for example, soldering. The projections 312 are inserted into the fixing holes 44, respectively, and are fixed to the fixing holes 44 by, for example, thermal caulking.

As shown in FIG. 10, the magnetic sensors 50, 60 and the capacitors 71-77 are installed to a first surface (common surface) 415 of the circuit board 41. Furthermore, as shown in FIG. 11, an electronic component is not installed to a second surface 416 of the circuit board 41, which is opposite from the first surface 415 in a direction perpendicular to a plane of the circuit board 41. In this way, the magnetic sensors 50, 60 and the capacitors 71-74 can be surface mounted to the circuit board 41 through a single reflow process.

Next, the main magnetic sensor 50 and the sub magnetic sensor 60 will be described. In the present embodiment, the main magnetic sensor 50 and the sub magnetic sensor 60 are named for the descriptive purpose based on whether the signal outputted from the magnetic sensor 50, 60 is a main signal Sm or a sub signal Ss regardless of that the main magnetic sensor 50 and the sub magnetic sensor 60 are substantially identical to each other in terms of the function and the structure. The structures of the main magnetic sensor 50 will be indicated by 500-series reference numerals, and the structures of the sub magnetic sensor 60 will be indicated by 600-series reference numbers. If the last two digits of any of the 500-series reference numerals, which is used to indicate the corresponding structure of the main magnetic sensor 50, are identical to the last two digits of the 600-series reference numerals, which is used to indicate the corresponding structure of the sub magnetic sensor 60, these structures correspond with each other (i.e., the identical or similar structures). Hereinafter, the main magnetic sensor 50 will be mainly described, and the description of the sub magnetic sensor 60 will be omitted at the appropriate parts of the following description.

The main magnetic sensor 50 includes a circuit 510 (see FIG. 13), an encapsulating portion 520, a primary terminal group 530 and a secondary terminal group 540. The circuit 510 includes magnetic sensing elements 511. The main magnetic sensor 50 is installed to the circuit board 41 in such a manner that at least a part of the encapsulating portion 520 overlaps with the corresponding cutout 42.

Figure 8:
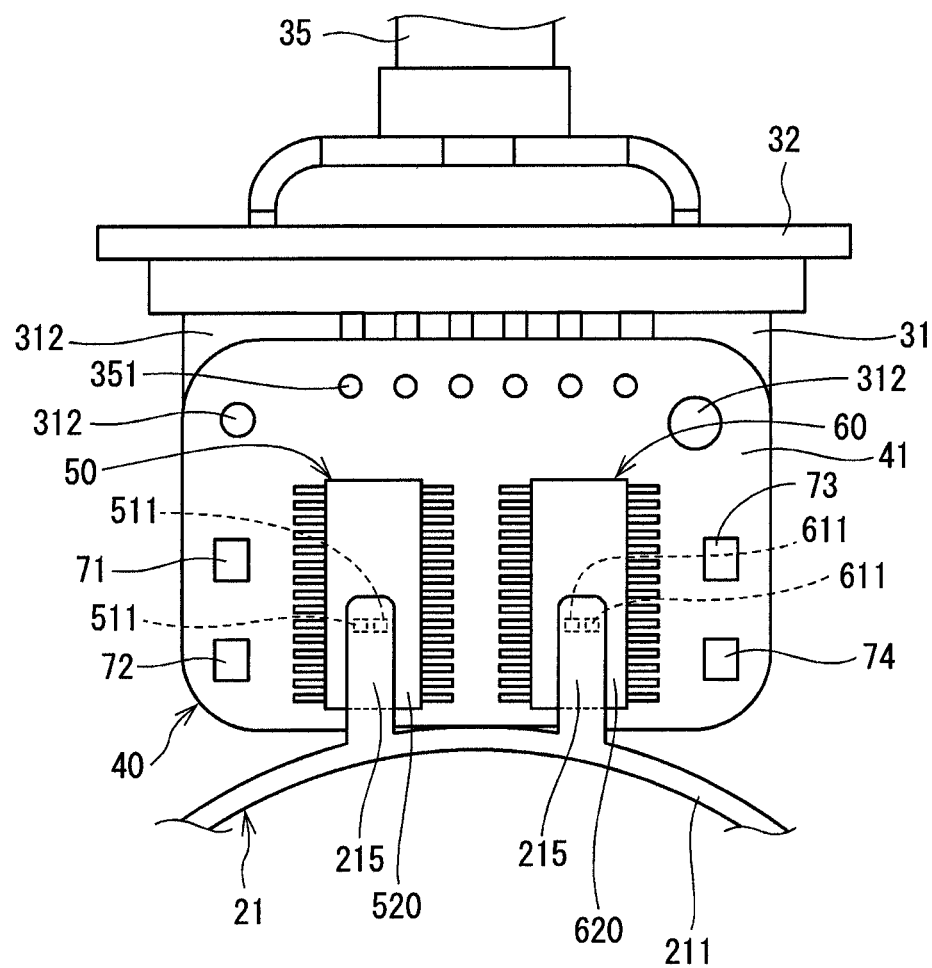
FIG. 8 is a plan view for describing a positional relationship between magnetic collecting portions and a sensor unit according to the embodiment of the present disclosure.

The magnetic sensing elements 511 are, for example, Hall elements and sense a magnetic flux between the corresponding magnetic collecting portion 215 and the corresponding magnetic collecting portion 225. As shown in FIGS. 8, 10 and 11, when the magnetic sensing elements 511 are viewed from the first surface 415 side or the second surface 416 side, the magnetic sensing elements 511 are placed in an area where the corresponding magnetic collecting portion 215 and the corresponding magnetic collecting portion 225 are placed. That is, the magnetic sensing elements 511 are placed between the corresponding magnetic collecting portion 215 and the corresponding magnetic collecting portion 225 in the direction that is perpendicular to the plane of the circuit board 41. In the present embodiment, the cutout 42 is formed in the circuit board 41. When the magnetic collecting portion 225 is inserted into the cutout 42, a distance between the magnetic collecting portion 215 and the magnetic collecting portion 225 can be minimized, so that a magnetic circuit gap can be reduced. In this way, it is possible to form the magnetic circuit, which is equivalent to a magnetic circuit of a case where the magnetic sensor is not surface mounted to the circuit board. Therefore, the magnetic flux between the magnetic collecting portion 215 and the magnetic collecting portion 225 can be appropriately sensed.

The encapsulating portion 520 encapsulates the circuit 510 and is configured into a generally rectangular form in a plan view of the encapsulating portion 520. Hereinafter, one long side of the encapsulating portion 520 will be referred to as a primary terminal forming part 521, and the other longitudinal side of the encapsulating portion 520 will be referred to as a secondary terminal forming part 522. Furthermore, a short side of the encapsulating portion 520, which is located on a side where the wire receiving holes 43 are placed, will be referred to as a wire side end part 523. Also, another short side of the encapsulating portion 520, which is located on a side where the cutouts 42 are opened, will be referred to as an opening side end part 524.

In the present embodiment, the magnetic sensing elements 511 are placed on the opening side end part 524 side of a center line C1, which bisects each of the primary and secondary terminal forming parts 521, 522. The center line C1 extends in a direction of a row of the magnetic sensors 50, 60, along which the magnetic sensors 50, 60 are arranged one after another.

The primary terminal group 530 projects from the primary terminal forming part 521, and the secondary terminal group 540 projects from the secondary terminal forming part 522. The primary and secondary terminal groups 530, 540 are connected to the circuit board 41 by, for example, soldering. In the present embodiment, a distance between the primary terminal forming part 521 and the secondary terminal forming part 522 will be referred to as a width of the encapsulating portion 520. In such a case, the width of the encapsulating portion 520 is set to be larger than a width of the cutout 42. In this way, a space for applying the solder, which is used at the time of connecting the terminal groups 530, 540 to the circuit board 41, is ensured, and thereby a reliability of the connection is improved.

In the main magnetic sensor 50, the primary terminal group 530 and the secondary terminal group 540 are placed symmetrically to each other with respect to a center line C2, which is centered between the primary terminal forming part 521 and the secondary terminal forming part 522. In the sub magnetic sensor 60, the primary terminal group 630 and the secondary terminal group 640 are placed symmetrically to each other with respect to a center line C3, which is a center between the primary terminal forming part 621 and the secondary terminal forming part 622.

Figure 12:
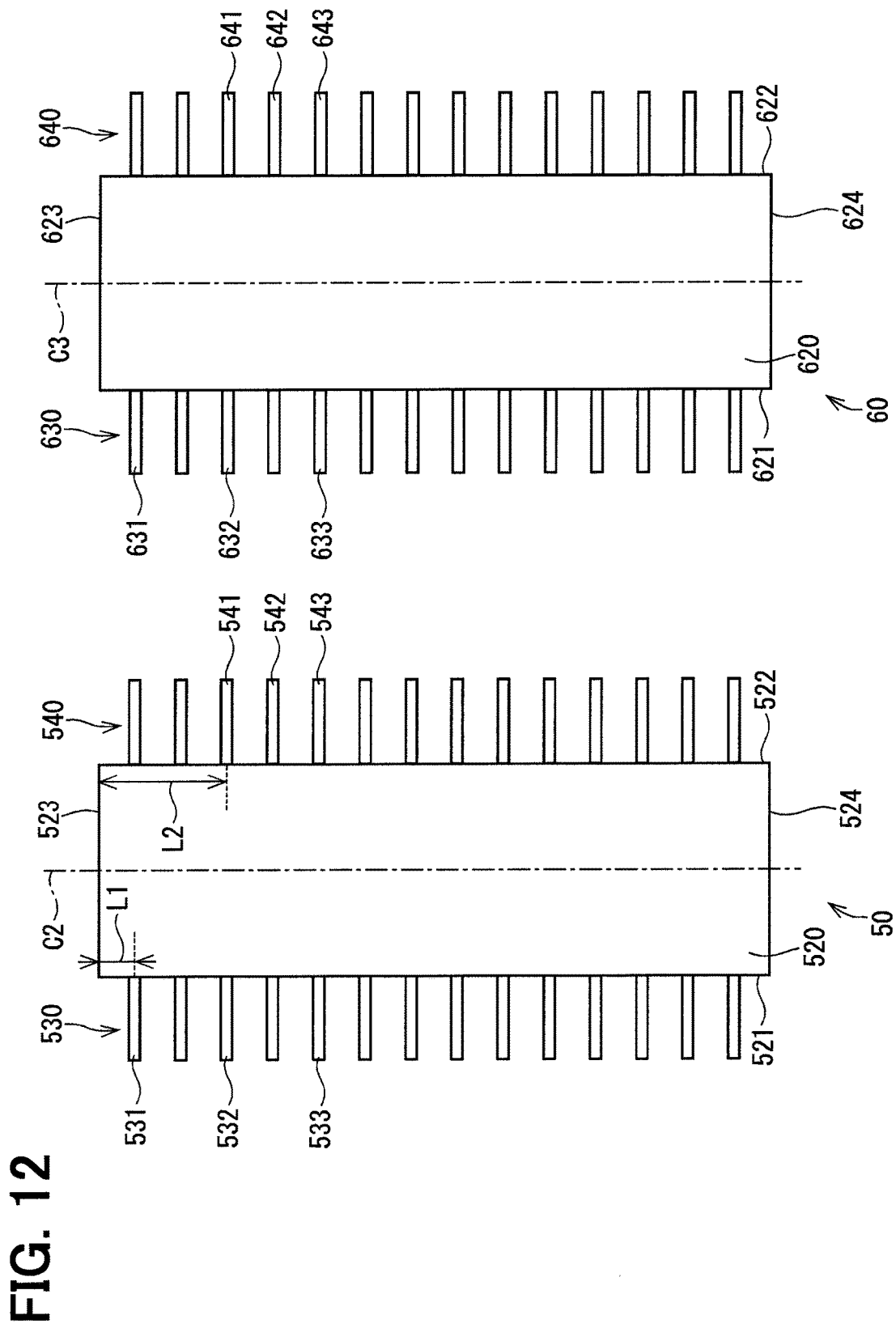
FIG. 12 is a plan view showing the magnetic sensors according to the embodiment of the present disclosure.

The terminal arrangement will be described with reference to FIG. 12. FIG. 12 schematically indicates the magnetic sensors 50, 60, which are mounted to the circuit board 41. In FIG. 12, the depiction of the circuit board 41 is omitted for the sake of simplicity. This is also true in FIG. 15, which will be described later.

As shown in FIG. 12, the primary terminal group 530 includes fourteen terminals, which include a primary output terminal 531, a primary ground terminal 532 and a primary power supply terminal 533. The fourteen terminals of the primary terminal group 530 are numbered as first to fourteenth terminals, which are arranged one after another in this order from the side where the wire side end part 523 is placed, and the first terminal, the third terminal and the fifth terminal are formed as the primary output terminal 531, the primary ground terminal 532 and the primary power supply terminal 533, respectively. That is, in the primary terminal group 530, the primary output terminal 531, the primary ground terminal 532, and the primary power supply terminal 533 are arranged in this order from the side where the wire side end part 523 is placed.

The secondary terminal group 540 includes fourteen terminals, which include a secondary output terminal 541, a secondary ground terminal 542 and a secondary power supply terminal 543. The fourteen terminals of the secondary terminal group 540 are numbered as first to fourteenth terminals, which are arranged one after another in this order from the side where the wire side end part 523 is placed, and the third terminal, the fourth terminal and the fifth terminal are formed as the secondary output terminal 541, the secondary ground terminal 542 and the secondary power supply terminal 543, respectively. That is, in the secondary terminal group 540, the secondary output terminal 541, the secondary ground terminal 542, and the secondary power supply terminal 543 are arranged in this order from the side where the wire side end part 523 is placed.

The primary output terminal 531 of the primary terminal group 530 and the secondary output terminal 541 of the secondary terminal group 540 are placed asymmetrically to each other with respect to the center line C2.

The primary output terminal 531 and the secondary output terminal 541 are constructed such that a voltage signal, which is proportional to a measurement value measured with the magnetic sensing element 511, can be outputted from the primary output terminal 531 and the secondary output terminal 541.

The primary ground terminal 532 and the secondary ground terminal 542 are constructed such that the primary ground terminal 532 and the secondary ground terminal 542 are connectable with the ground (the earth) through the ECU 85.

The primary power supply terminal 533 and the secondary power supply terminal 543 are constructed such that a predetermined voltage (e.g., 5 V) can be outputted as an input voltage Vin from a regulator (not shown) of the ECU 85 to the primary power supply terminal 533 and the secondary power supply terminal 543.

According to the present embodiment, at the main magnetic sensor 50, the primary output terminal 531, the primary ground terminal 532 and the primary power supply terminal 533 are connected to the ECU 85 through an electric wiring pattern (hereinafter referred to as a wiring pattern) formed on the circuit board 41 and the electric wire member 35.

At the sub magnetic sensor 60, the secondary output terminal 641, the secondary ground terminal 642 and the secondary power supply terminal 643 are connected to the ECU 85 through the wiring pattern formed on the circuit board 41 and the electric wire member 35.

That is, according to the present embodiment, the main signal Sm is outputted from the primary output terminal 531 of the main magnetic sensor 50 to the ECU 85, and the sub signal Ss is outputted from the secondary output terminal 641 of the sub magnetic sensor 60 to the ECU 85.

The secondary output terminal 541, the secondary ground terminal 542 and the secondary power supply terminal 543 of the main magnetic sensor 50, and the primary output terminal 631, the primary ground terminal 632 and the primary power supply terminal 633 of the sub magnetic sensor 60, which are located on the inner side where the main magnetic sensor 50 and the sub magnetic sensor 60 are opposed to each other, are not connected to the wiring pattern formed on the circuit board 41.

In the primary terminal group 530 and the secondary terminal group 540, the terminals, which are other than the output terminals 531, 541, the ground terminals 532, 542 and the power supply terminals 533, 543, are test terminals, which are used only in an initial test operation and do not normally function at a stage where the main magnetic sensor 50 and the sub magnetic sensor 60 are applied to the torque sensor 10.

As shown in FIG. 10, the capacitors 71-74 are chip capacitors, such as ceramic capacitors, and are used for, for example, noise suppression. The capacitors 71-74 are placed on two opposite sides of the magnetic sensors 50, 60. Specifically, the capacitors 71, 72 are placed on the opposite side of the main magnetic sensor 50, which is opposite from the sub magnetic sensor 60, i.e., on the side of the main magnetic sensor 50 where the primary terminal group 530 is placed. Furthermore, the capacitors 73, 74 are placed on the opposite side of the sub magnetic sensor 60, which is opposite from the main magnetic sensor 50, i.e., on the side of the sub magnetic sensor 50 where the secondary terminal group 640 is placed. An area, in which the magnetic sensors 50, 60 are mounted, will be referred to as a sensor area Rs. By placing the capacitors 71-74 at the outside of the sensor area Rs, the magnetic sensors 50, 60 can be placed closest to each other. In the present embodiment, as indicated by a dot-dot-dash line in FIG. 10, the sensor area Rs is an area, which is defined by outer peripheral edges of the magnetic sensors 50, 60.

In this way, the main magnetic sensor 50 and the sub magnetic sensor 60 can be placed closest to each other.

The capacitor 71 is connected to the primary output terminal 531 and the primary ground terminal 532. The capacitor 72 is connected to the primary ground terminal 532 and the primary power supply terminal 533. In the present embodiment, the primary output terminal 531, the primary ground terminal 532 and the primary power supply terminal 533 are arranged in this order from the side where the wire side end part 523 is placed. Therefore, the formation of the wiring pattern is eased.

The capacitor 73 is connected to the secondary output terminal 641 and the secondary ground terminal 642. The capacitor 74 is connected to the secondary ground terminal 642 and the secondary power supply terminal 643. In the present embodiment, the secondary output terminal 641, the secondary ground terminal 642 and the secondary power supply terminal 643 are arranged in this order from the side where the wire side end part 523 is placed. Therefore, the formation of the wiring pattern is eased.

Figure 13:
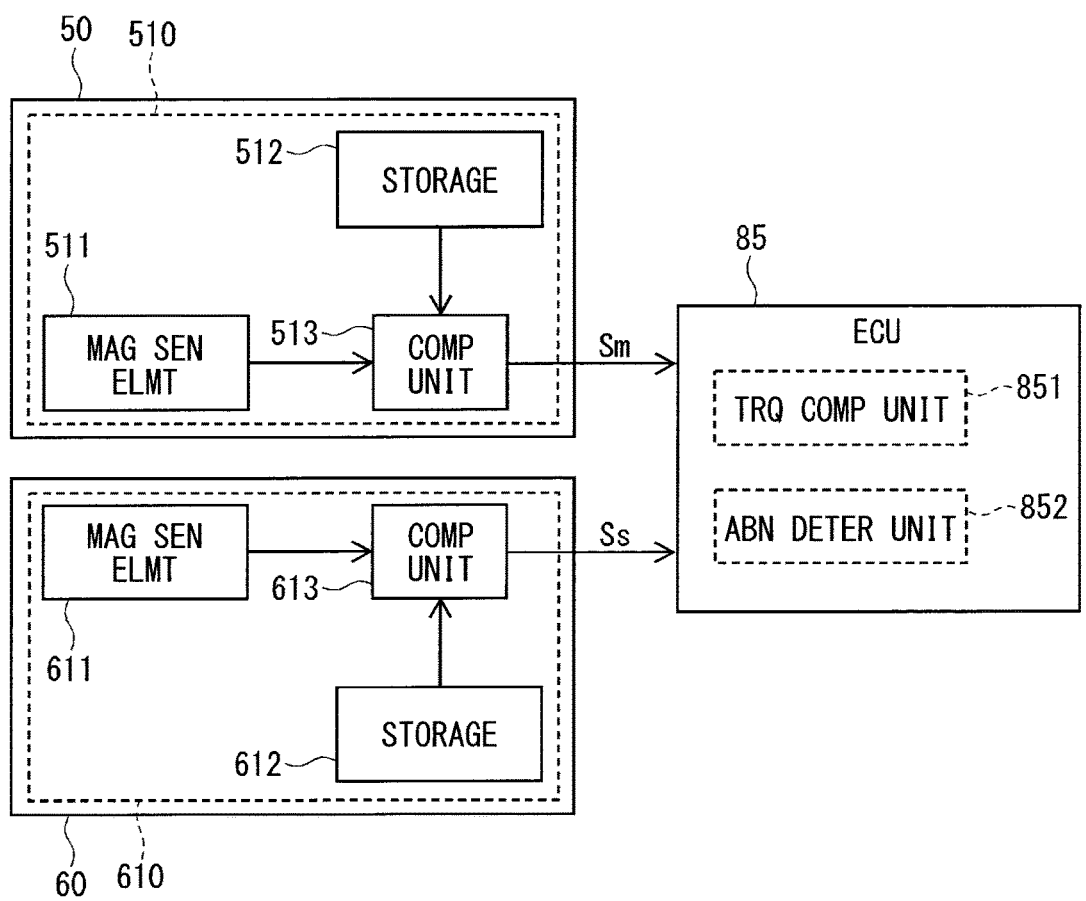
FIG. 13 is a block diagram showing circuits according to the embodiment of the present disclosure.

As shown in FIG. 13, the circuit 510 includes the magnetic sensing elements 511, a storage (e.g., a memory) 512 and a computing unit 513.

The magnetic sensing elements 511 sense a magnetic flux that flows between the corresponding magnetic collecting portion 215 and the corresponding magnetic collecting portion 225. In FIG. 13, the two magnetic sensing elements 511 are indicated as one functional block.

Now, a sensing operation for sensing the steering torque with the magnetic sensing elements 511 will be described.

In the present embodiment, the magnetic sensing elements 511 are placed between the corresponding magnetic collecting portion 215 and the corresponding magnetic collecting portion 225. When the steering torque is not applied between the input shaft 11 and the output shaft 12, the center of each of the teeth of the first yoke 17 and the teeth of the second yoke 18 coincides with the boundary between the corresponding N-pole and the corresponding S-pole of the multipole magnet 15. At this time, at each of the teeth 175, 185, the total number of magnetic lines of force, which are outputted from the N-pole to the tooth 175, 185 or inputted from the tooth 175, 185 to the N-pole, is equal to the total number of magnetic lines of force, which are outputted from the S-pole to the tooth 175, 185 or inputted from the tooth 175, 185 to the S-pole. Therefore, the magnetic lines of force form a closed loop in each of the inside of the first yoke 17 and the inside of the second yoke 18. Thus, the magnetic flux will not be leaked into the gap between the yokes 17, 18, so that a density of the magnetic flux, which is sensed with the magnetic sensing element 511, becomes zero.

When a torsional displacement is generated in the torsion bar 13 upon application of the steering torque between the input shaft 11 and the output shaft 12, a relative positional change occurs in the circumferential direction between the multipole magnet 15, which is fixed to the input shaft 11, and the yokes 17, 18, which are fixed to the output shaft 12. Therefore, the density of the magnetic flux, which passes through the magnetic sensing element 511, becomes generally proportional to the amount of the torsional displacement of the torsion bar 13, and the polarity of the magnetic flux, which passes through the magnetic sensing element 511, is reversed according to a twisting direction of the torsion bar 13. The magnetic sensing element 511 senses the strength of the magnetic field that passes through the magnetic sensing element 511 in a thickness direction of the magnetic sensor 45, i.e., a direction that is perpendicular to the surfaces of the magnetic collecting portions 215, 225.

The storage 512 is, for example, a nonvolatile memory, such as an EEPROM. The storage stores, for examples, a parameter used for correction of an assembling error and/or a parameter used for correction of the temperature.

Figure 14A:
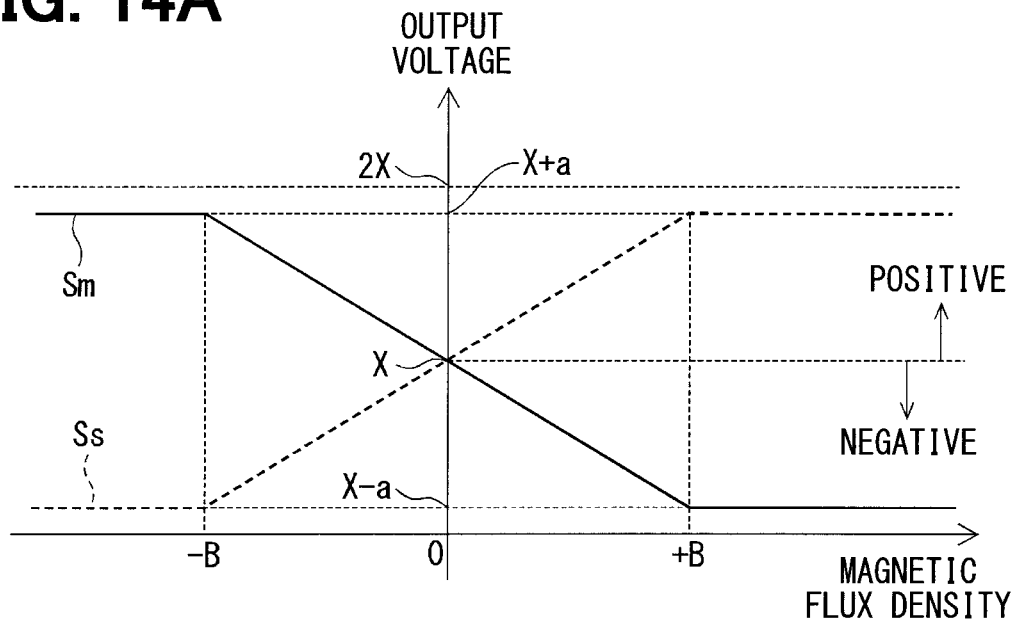
FIGS. 14A and 14B are diagrams for describing a main signal and a sub signal according to the embodiment of the present disclosure.
Figure 14B:
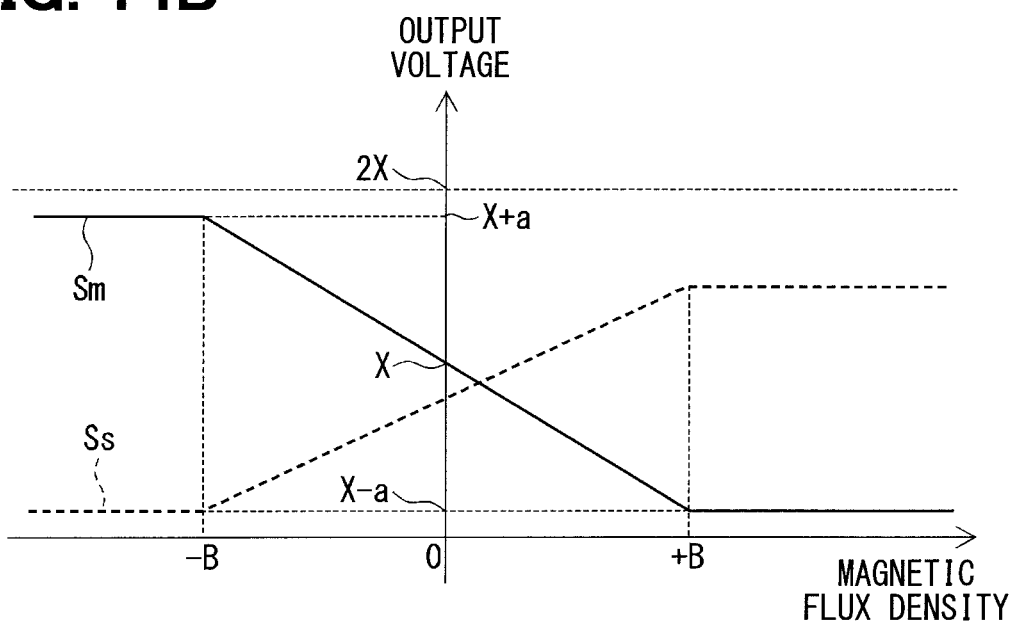

Furthermore, the storage 512 stores change setting information (switch setting information). The change setting information is information that is used to command which one of the main signal Sm and the sub signal Ss shown in FIGS. 14A and 14B is outputted based on the measurement value of the magnetic sensing element 511.

In the present embodiment, the main signal Sm is outputted from the main magnetic sensor 50, and the sub magnetic signal Ss is outputted from the sub magnetic sensor 60. The storage 512 of the main magnetic sensor 50 stores the information for outputting the main signal, and the storage 612 of the sub magnetic sensor 60 stores the information for outputting the sub signal.

Details of the main signal Sm and the sub signal Ss will be described later.

The computing unit 513 includes a computer (a microcomputer), such as a digital signal processor (DSP) to execute various computing processes. The computing unit 513 performs a correction computation for correcting the measurement value of the magnetic sensing element 511 based on, for example, the assembling error and/or the temperature. The computing unit 513 of the main magnetic sensor 50 generates the main signal Sm as a signal to be outputted to the ECU 85 based on the change setting information obtained from the storage 512. Furthermore, the computing unit 613 of the sub magnetic sensor 60 generates the sub signal Ss as a signal to be outputted to the ECU 85 based on the change setting information obtained from the storage 612.

The ECU 85 includes a torque computing unit 851 and an abnormality determining unit 852, as functional blocks.

The torque computing unit 851 computes the steering torque based on the main signal Sm in a case where the main signal Sm is normal. Furthermore, the torque computing unit 851 computes the steering torque based on the sub signal Ss in a case where the main signal Sm is abnormal, and the sub signal Ss is normal.

The abnormality determining unit 852 performs abnormality determination of the main signal Sm and the sub signal Ss.

Here, the main signal Sm and the sub signal Ss will be described with reference to FIGS. 14A and 14B.

The magnetic sensors 50, 60 output a voltage signal, which is proportional to the density of the magnetic flux measured with the magnetic sensing elements 511, 611, as the main signal Sm or the sub signal Ss to the ECU 85. The main signal Sm and the sub signal Ss are designed as follows. Specifically, one of the main signal Sm and the sub signal Ss is positive relative to the reference value X, and the other one of the main signal Sm and the sub signal Ss is negative relative to the reference value X. In other words, a plus or minus sign (+ or − sign) of the main signal Sm relative to the reference value X and a plus or minus sign (+ or − sign) of the sub signal Ss relative to the reference value X are opposite to each other. A difference between the main signal Sm and the reference value X is the same as a difference between the sub signal Ss and the reference value X. Here, when the main signal Sm is larger than the reference value X, the main signal Sm is positive. In contrast, when the main signal Sm is smaller than the reference value X, the main signal Sm is negative. Furthermore, when the sub signal Ss is larger than the reference value X, the sub signal Ss is positive. In contrast, when the sub signal Ss is smaller than the reference value, the sub signal Ss is negative. According to the present embodiment, in a case where the density of the magnetic flux is negative, the main signal Sm is positive relative to the reference value X, and the sub signal Ss is negative relative to the reference value X. In contrast, in a case where the density of the magnetic flux is positive, the main signal Sm is negative relative to the reference value X, and the sub signal Ss is positive relative to the reference value X. Furthermore, a saturation guard is provided as follows. Specifically, in a case where the density of the magnetic flux is equal to or smaller than a predetermined negative value −B, X+a (here, a<X) is outputted as the main signal Sm, and X−a is outputted as the sub signal. Furthermore, in a case where the density of the magnetic flux is equal to or larger than a positive predetermined value +B, X−a is outputted as the main signal Sm, and X+a is outputted as the sub signal Ss.

The reference value X is set to be a value that is one half of an input voltage Vin, which is inputted from the ECU 85 to the power supply terminal 533, 643. Specifically, for example, in a case where the input voltage Vin is 5 V, the reference value X is 2.5 V. However, the value of the specific value X is not limited to this.

As shown in FIG. 14A, in a case where both of the main signal Sm and the sub signal Ss are normal, a sum of the main signal Sm and the sub signal Ss becomes a value that is two times larger than the reference value X. That is, there will be Sm+Ss=2X. Hereinafter, the value, which is two times larger than the reference value X, will be referred to as "a determination value 2X".

In contrast, as shown in FIG. 14B, in a case where the main signal Sm or the sub signal Ss is abnormal, the sum of the main signal Sm and the sub signal Ss becomes a value that is different from the determination value 2X. That is, there will be Sm+Ss≠2X.

Therefore, in a case where the sum of the main signal Sm and the sub signal Ss is within a predetermined range that includes the determination value 2X, the abnormality determining unit 852 determines that the main signal Sm and the sub signal Ss are normal. In contrast, in a case where the sum of the main signal Sm and the sub signal Ss is not within the predetermined range that includes the determination value 2X, the abnormality determining unit 852 determines that at least one of the main signal Sm and the sub signal Ss is abnormal.

In the present embodiment, in order to form the main magnetic sensor 50 and the sub magnetic sensor 60 as a redundant structure, it is desirable that the magnetic flux, which is sensed with the main magnetic sensor 50, is much the same as the magnetic flux, which is sensed with the sub magnetic sensor 60.

Therefore, as shown in FIGS. 10 and 11, in the present embodiment, the main magnetic sensor 50 and the sub magnetic sensor 60 are placed closest to each other.

In the present embodiment, for the purpose of reducing the total number of types of components, the main magnetic sensor 50 and the sub magnetic sensor 60 are identical to each other. Furthermore, the magnetic sensing elements 511, 611 are displaced from the center line C1 in each of the magnetic sensors 50, 60. Therefore, in order to sense the same magnetic flux with the magnetic sensors 50, 60, the magnetic sensors 50, 60 cannot be oriented opposite to each other, and thereby the magnetic sensors 50, 60 need to be mounted on the circuit board 41 such that the magnetic sensors 50, 60 are oriented in the common direction and are arranged side by side on the circuit board 41. In the case where the magnetic sensors 50, 60 are oriented in the common direction, in the main sensor 50, the primary terminal group 530 is placed on the opposite side (i.e., the outer side) of the main magnetic sensor 50, which is opposite from the sub magnetic sensor 60, and the secondary terminal group 540 is placed on the sub magnetic sensor 60 side (i.e., the inner side) of the main magnetic sensor 50. Furthermore, in the sub sensor 60, the primary terminal group 630 is placed on the magnetic sensor 50 side (i.e., the inner side) of the sub magnetic sensor 60, and the secondary terminal group 640 is placed on the opposite side (i.e., the outer side) of the sub magnetic sensor 60, which is opposite from the main magnetic sensor 50.

In the present embodiment, each of the primary terminal group 530 and the secondary terminal group 540 of the main magnetic sensor 50 includes the output terminal 531, 541, the ground terminal 532, 542 and the power supply terminal 533, 543, so that each of the primary terminal group 530 and the secondary terminal group 540 can be connected to the ECU 85. Similarly, each of the primary terminal group 630 and the secondary terminal group 640 of the sub magnetic sensor 60 includes the output terminal 631, 641, the ground terminal 632, 642 and the power supply terminal 633, 643, so that each of the primary terminal group 630 and the secondary terminal group 640 can be connected to the ECU 85.

The primary output terminal 531, the primary ground terminal 532 and the primary power supply terminal 533, which are located at the outer side of the main magnetic sensor 50, are connected to the ECU 85. Furthermore, the secondary output terminal 641, the secondary ground terminal 642 and the secondary power supply terminal 643, which are located at the outer side of the sub magnetic sensor 60, are connected to the ECU 85. With the above construction, the wiring pattern at the circuit board 41 can be easily formed.

Next, the pin arrangement will be described.

Figure 15:
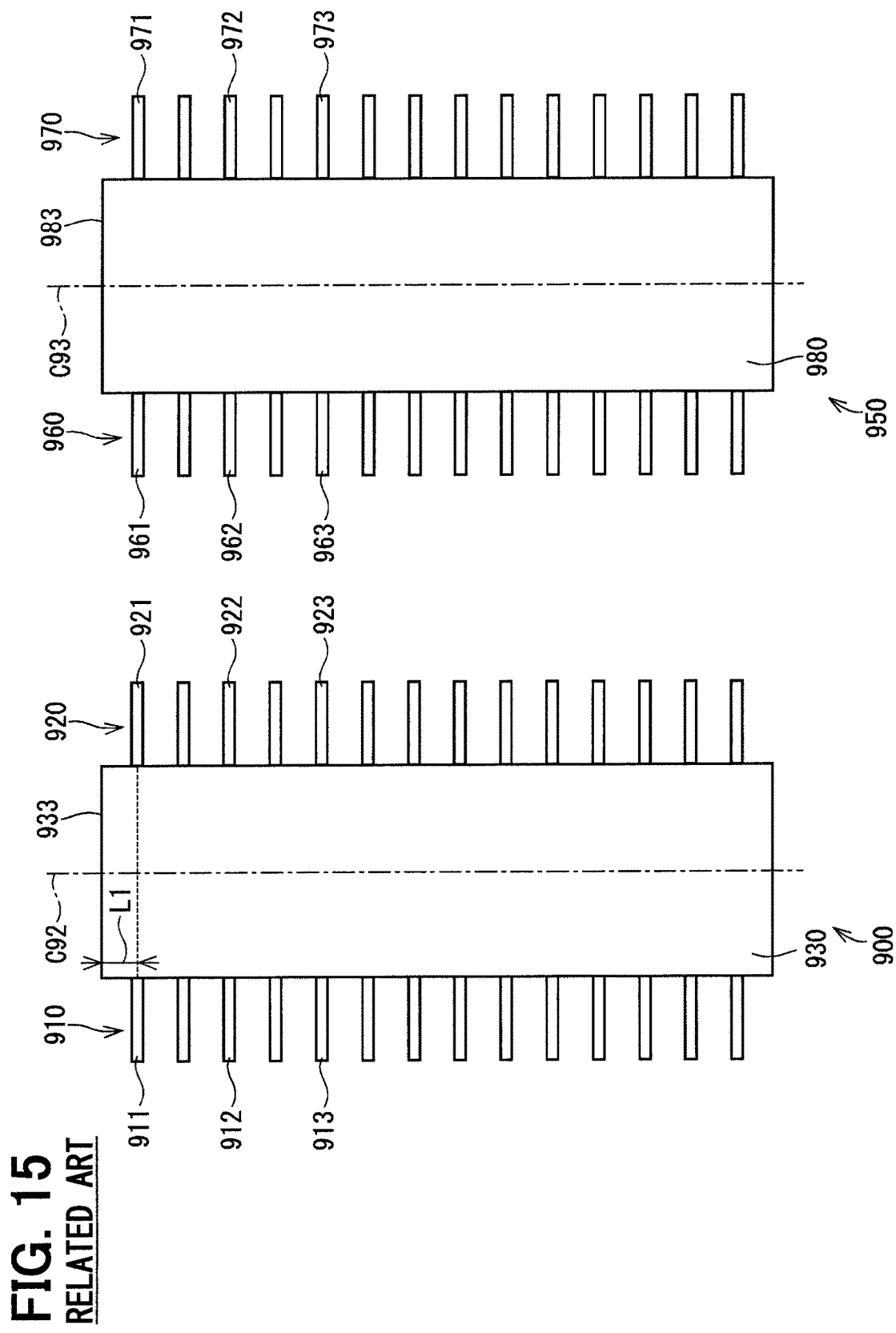
FIG. 15 is a plan view showing magnetic sensors of a comparative exemplary case.

FIG. 15 shows a comparative exemplary case where the pin arrangement is a line symmetrical arrangement. With reference to FIG. 15, in each of a primary terminal group 910 and a secondary terminal group 920 in a main magnetic sensor 900 of the comparative exemplary case, first to fourteenth terminals are arranged one after another in this order from the side where a wire side end part 933 of an encapsulating portion 930 is placed, and the first terminal, the third terminal and the fifth terminal are formed as an output terminal 911, 921, a ground terminal 912, 922 and a power supply terminal 913, 923, respectively. That is, in the comparative exemplary case, the primary output terminal 911 and the secondary output terminal 921 are placed symmetrically to each other with respect to a center line C92. In other words, a distance between the primary output terminal 911 and the wire side end part 933 and a distance between the secondary output terminal 921 and the wire side end part 933 are equal to each other and are respectively denoted as a distance L1. A sub magnetic sensor 950 has the same arrangement as that of the main magnetic sensor 900 discussed above.

Similar to the main magnetic sensor 900, in each of a primary terminal group 960 and a secondary terminal group 970 in the sub magnetic sensor 950 of the comparative exemplary case, first to fourteenth terminals are arranged one after another in this order from the side where a wire side end part 983 of an encapsulating portion 980 is placed, and the first terminal, the third terminal and the fifth terminal are formed as an output terminal 961, 971, a ground terminal 962, 972 and a power supply terminal 963, 973, respectively. That is, in the comparative exemplary case, the primary output terminal 961 and the secondary output terminal 971 are placed symmetrically to each other with respect to a center line C93.

In this case, the secondary output terminal 921 of the main magnetic sensor 900 and the primary output terminal 961 of the sub magnetic sensor 950 are opposed to each other, so that there is a possibility of generating a failure caused by short circuit between the output terminals 921, 961.

As discussed with reference to FIGS. 14A and 14B, one of the main signal Sm and the sub signal Ss is positive relative to the reference value X, and the other one of the main signal Sm and the sub signal Ss is negative relative to the reference value X. Therefore, when pin-to-pin short circuit (or simply referred to as short circuit) occurs between the secondary output terminal 921 of the main magnetic sensor 900 and the primary output terminal 961 of the sub magnetic sensor 950, the main signal Sm and the sub signal Ss both become the reference value X. The abnormality determining unit 852 executes the abnormality detection based on the sum of the main signal Sm and the sub signal Ss. If the pin-to-pin short circuit occurs between the secondary output terminal 921 of the main magnetic sensor 900 and the primary output terminal 961 of the sub magnetic sensor 950, the sum of the main signal Sm and the sub signal Ss become the determination value 2X. Therefore, the abnormality determining unit 852 cannot sense the pin-to-pin short circuit.

In the present embodiment, as shown in FIG. 12, in order to avoid the pin-to-pin short-circuit between the output terminals 541, 631, the primary output terminal 531 and the secondary output terminal 541 of the main magnetic sensor 50 are placed asymmetrically to each other with respect to the center line C2, and the primary output terminal 631 and the secondary output terminal 641 of the sub magnetic sensor 60 are placed asymmetrically to each other with respect to the center line C3. In other words, the distance L1 between the primary output terminal 531 and the wire side end part 523 differs from the distance L2 between the secondary output terminal 541 and the wire side end part 523. Here, the distance L1 is a distance between a center of the primary output terminal 531 of the primary terminal forming part 521 and the wire side end part 523. The distance l2 is a distance between a center of the secondary output terminal 541 of the secondary terminal forming part 522 and the wire side end part 523.

In the case where the distance L1 and the distance L2 are different from each other, even when the main magnetic sensor 50 and the sub magnetic sensor 60 are oriented in a common direction while the wire side end part 523 of the main magnetic sensor 50 and the wire side end part 623 of the sub magnetic sensor 60 are placed to extend along a common line, which is perpendicular to the center lines C2, C3, the secondary output terminal 541 of the main magnetic sensor 50 and the primary output terminal 631 of the sub magnetic sensor 60 are not opposed to each other in the direction perpendicular to the center lines C2, C3. Thereby, it is possible to limit the generation of the pin-to-pin short circuit between the secondary output terminal 541 and the primary output terminal 631.

When the terminal number one to the terminal number fourteen are assigned to the first to fourteenth terminals, respectively, which are arranged at the primary terminal forming part 521 in this order from the side where the wire side end part 523 is placed in the main magnetic sensor 50, the terminal number of the primary output terminal 531 is the number one. Also, when the terminal number one to the terminal number fourteen are assigned to the first to fourteenth terminals, respectively, which are arranged at the primary terminal forming part 621 in this order from the side where the wire side end part 623 is placed in the sub magnetic sensor 60, the terminal number of the primary output terminal 631 is the number one. Furthermore, when the terminal number one to the terminal number fourteen are assigned to the first to fourteenth terminals, respectively, which are arranged at the secondary terminal forming part 522 in this order from the side where the wire side end part 523 is placed in the main magnetic sensor 50, the terminal number of the secondary output terminal 541 is the number three. Also, when the terminal number one to the terminal number fourteen are assigned to the first to fourteenth terminals, respectively, which are arranged at the secondary terminal forming part 622 in this order from the side where the wire side end part 623 is placed in the sub magnetic sensor 60, the terminal number of the secondary output terminal 641 is the number three. When the terminal number difference is two or more between the secondary output terminal 541 of the main magnetic sensor 50 and the primary output terminal 631 of the sub magnetic sensor 60, at least one row of terminals is placed between the secondary output terminal 541 of the main magnetic sensor 50 and the primary output terminal 631 of the sub magnetic sensor 60. Therefore, the generation of the pin-to-pin short circuit between the secondary output terminal 541 and the primary output terminal 631 can be reliably avoided.

Furthermore, in the present embodiment, the primary output terminal 531 is placed closest to the wire side end part 523 among the terminals of the primary terminal group 530. Therefore, the wiring pattern, which connects between the primary output terminal 531 and the electric wire member 35, is shortened.

As discussed above, the sensor unit 40 includes the magnetic sensors 50, 60 and the circuit board 41.

The main magnetic sensor 50 includes the magnetic sensing elements 511, the encapsulating portion 520, the primary terminal group 530 and the secondary terminal group 540. The magnetic sensing elements 511 sense the magnetic field. The encapsulating portion 520 encapsulates the magnetic sensing elements 511. The primary terminal group 530 includes the terminals that project from the primary terminal forming part 521, which is the one side of the encapsulating portion 520. The secondary terminal group 540 includes the terminals that project from the secondary terminal forming part 522, which is the opposite side of the encapsulating portion 520 opposite from the primary terminal forming part 521.

Similarly, the sub magnetic sensor 60 includes the magnetic sensing elements 611, the encapsulating portion 620, the primary terminal group 630 and the secondary terminal group 640. The magnetic sensing elements 611 sense the magnetic field. The encapsulating portion 620 encapsulates the magnetic sensing elements 611. The primary terminal group 630 includes the terminals, which project from the primary terminal forming part 621, which is the one side of the encapsulating portion 620. The secondary terminal group 640 includes the terminals that project from the secondary terminal forming part 622, which is the opposite side of the encapsulating portion 620 opposite from the primary terminal forming part 621.

The magnetic sensors (plurality of magnetic sensors) 50, 60 are mounted to the common surface of the circuit board 41.

The adjacent two magnetic sensors 50, 60, which are oriented in the common direction, are arranged such that the secondary terminal group 540 of one of the adjacent two magnetic sensors 50, 60 is opposed to the primary terminal group 630 of the other one of the adjacent two magnetic sensors 50, 60.

The terminals of the primary terminal group 530, 630 of each of the magnetic sensors 50, 60 include the primary output terminal 531, 631 for outputting the output signal based on the measurement value of the magnetic sensing element 511, 611.

The terminals of the secondary terminal group 540, 640 of each of the magnetic sensors 50, 60 include the secondary output terminal 541, 641 for outputting the output signal.

The primary output terminal 531 and the secondary output terminal 541 of the main magnetic sensor 50 are placed asymmetrically to each other with respect to the center line C2 centered between the primary terminal forming part 521 and the secondary terminal forming part 522. The primary output terminal 631 and the secondary output terminal 641 of the sub magnetic sensor 60 are placed asymmetrically to each other with respect to the center line C3 centered between the primary terminal forming part 621 and the secondary terminal forming part 622.

In the present embodiment, the two magnetic sensors 50, 60 are placed on the common surface of the circuit board 41. Therefore, the magnetic sensors 50, 60 can be mounted on the circuit board 41 in the single reflow process. Therefore, the manufacturing process can be shortened in comparison to the case where the magnetic sensor 50 is mounted on one of two opposed surfaces of the circuit board 41, and the magnetic sensor 60 is mounted on the other one of the opposed surfaces of the circuit board 41.

In the present embodiment, the primary output terminal 531 and the secondary output terminal 541 are placed asymmetrically to each other with respect to the center line C2, and the primary output terminal 631 and the secondary output terminal 641 are placed asymmetrically to each other with respect to the center line C3. Therefore, when the magnetic sensors 50, 60 are oriented in the common direction on the common surface of the circuit board 41, the secondary output terminal 541 of the main magnetic sensor 50 and the primary output terminal 631 of the sub magnetic sensor 60, which are placed at the inner side between the magnetic sensors 50, 60, are not opposed to each other and are displaced from each other in a direction that coincides with a direction of a row of the terminals of the secondary terminal group 540 and a direction of a row of the terminals of the primary terminal group 630. Thereby, even when the multiple magnetic sensors 50, 60 are placed adjacent to each other and are oriented in the common direction, it is possible to limit the generation of the pin-to-pin short circuit between the output terminals 541, 631.

The main magnetic sensor 50 includes the computing unit 513, which computes the output signal. The sub magnetic sensor 60 includes the computing unit 613, which computes the output signal.

The computing unit 513, 613 can change the output signal between the main signal Sm and the sub signal Ss, while one of the main signal and the sub signal is positive relative to the reference value X, and the other one of the main signal and the sub signal is negative relative to the reference value X.

Furthermore, one of the adjacent two magnetic sensors 50, 60 outputs the main signal Sm, and the other one of the adjacent two magnetic sensors 50, 60 outputs the sub signal.

In this way, the various computations and the abnormality detection, which use the main signal Sm and the sub signal Ss, can be appropriately performed. Furthermore, the identical magnetic sensors 50, 60 can be used to change the output signal between the main signal Sm and the sub signal Ss. Therefore, the total number of the components can be reduced.

The sensor unit 40 includes the capacitors 71-74, which are mounted to the surface, to which the magnetic sensors 50, 60 are mounted. The capacitors 71-74 are placed at the outside of the sensor area Rs, in which the multiple magnetic sensors 50, 60 are mounted.

In this way, in comparison to the case where the capacitors 71-74 are placed in the insides of the magnetic sensors 50, 60, the size of the magnetic sensor 50, 60 can be reduced. The capacitors 71-74 are mounted at the outside (two opposite sides of the magnetic sensors 50, 60 in the present embodiment) of the sensor area Rs, in which the magnetic sensors 50, 60 are mounted. Therefore, in comparison to the case where the capacitors 71-74 are mounted in the inside of the sensor area Rs, the sensors 50, 60 can be placed closer to each other.

The primary terminal group 530 of the main magnetic sensor 50 includes the primary power supply terminal 533 and the primary ground terminal 532. The primary terminal group 630 of the sub magnetic sensor 60 includes the primary power supply terminal 633 and the primary ground terminal 632.

The secondary terminal group 540 of the main magnetic sensor 50 includes the secondary power supply terminal 543 and the secondary ground terminal 542. The secondary terminal group 640 of the sub magnetic sensor 60 includes the secondary power supply terminal 643 and the secondary ground terminal 642.

The primary output terminal 531, the primary ground terminal 532 and the primary power supply terminal 533 are arranged one after another in this order. Furthermore, the primary output terminal 631, the primary ground terminal 632 and the primary power supply terminal 633 are arranged one after another in this order.

The secondary output terminal 541, the secondary ground terminal 542 and the secondary power supply terminal 543 are arranged one after another in this order. Furthermore, the secondary output terminal 641, the secondary ground terminal 642 and the secondary power supply terminal 643 are arranged one after another in this order.

The primary ground terminal 532, which is connected to the capacitors 71, 72, is placed between the primary power supply terminal 533 and the primary output terminal 531. In this way, the wiring pattern, which connects the primary ground terminal 532 to the capacitors 71, 72, can be easily formed. Similarly, the secondary ground terminal 642, which is connected to the capacitors 73, 74, is placed between the secondary power supply terminal 643 and the secondary output terminal 641. In this way, the wiring patter, which connects the secondary ground terminal 642 to the capacitors 73, 74, can be easily formed.

Furthermore, when the ground terminal 532, 542, 632, 642 is centered between the power supply terminal 533, 543, 633, 643 and the output terminal 531, 541, 631, 641, the short circuit between the power supply terminal 533, 543, 633, 643 and the output terminal 531, 541, 631, 641 can be limited.

The magnetic collector module 20 includes the sensor unit 40, the magnetic collecting rings 21, 22, the shield members 26, 27, the magnetic collecting ring holding member 25 and the circuit board holding member 31.

The magnetic collecting rings 21, 22 include the magnetic collecting portions 215, 225, and each of the magnetic sensors 50, 60 is interposed between the magnetic collecting portions 215, 225. The shield members 26, 27 shield the magnetism applied from the outside. The magnetic collecting ring holding member 25 and the circuit board holding member 31 hold the magnetic collecting rings 21, 22 and the sensor unit 40. In the present embodiment, the magnetic collecting ring holding member 25 and the circuit board holding member 31 serve as a holding member of the present disclosure.

In this way, the magnetic flux, which is collected by the magnetic collecting rings 21, 22, can be appropriately sensed with the magnetic sensors 50, 60.

(Other Embodiments)

(I) Magnetic Sensor

In the above embodiment, the total number of the magnetic sensors is two. In another embodiment, the total number of the magnetic sensors may be equal to or larger than three. In a case where the three or more magnetic sensors are arranged, it is desirable that the magnetic sensor(s), which outputs the main signal, and the magnetic sensor(s), which outputs the sub signal, are alternately arranged.

In the above embodiment, the main signal is outputted from the one of the magnetic sensors, and the sub signal is outputted from the other one of the magnetic sensors. In another embodiment, all of the output signals, which are outputted from the magnetic sensors, may be respectively the main signals or the sub signals. Furthermore, in the above embodiment, the main signal is the signal, which has the output voltage that is reduced when the density of the magnetic flux is increased. In another embodiment, the main signal may be a signal, which has an output voltage that is increased when the density of the magnetic flux is increased. Furthermore, in the above embodiment, the sub signal is the signal, which has the output voltage that is increased when the density of the magnetic flux is increased. In another embodiment, the sub signal may be a signal, which has an output voltage that is reduced when the density of the magnetic flux is increased.

In the above embodiment, in the primary terminal group of each of the main magnetic sensor 50 and the sub magnetic sensor 60, the first to fourteenth terminals are arranged in this order from the side where the wire side end part is placed. Among these terminals, the first terminal, the third terminal and the fifth terminal are the primary output terminal, the primary ground terminal and the primary power supply terminal, respectively. In the secondary terminal group of each of the main magnetic sensor 50 and the sub magnetic sensor 60, the first to fourteenth terminals are arranged in this order from the side where the wire side end part is placed. Among these terminals, the third terminal, the fourth terminal and the fifth terminal are the secondary output terminal, the secondary ground terminal and the secondary power supply terminal, respectively. In another embodiment, it is only required that the primary output terminal and the secondary output terminal are placed asymmetrically to each other with respect to the center line between the primary terminal forming part and the secondary terminal forming part in each of the magnetic sensors.

Furthermore, in the above embodiment, each of the primary terminal group and the secondary terminal group includes the fourteen terminals. In another embodiment, the total number of terminals of the primary terminal group and the total number of terminals of the secondary terminal group can be any number.

Furthermore, in the above embodiment, the power supply terminal, the ground terminal and the output terminal are arranged one after another in this order. In another embodiment, any other type of arrangement of the terminals may be employed. For example, the power supply terminal may be centered between the ground terminal and the output terminal.

In another embodiment, the primary terminal group and the secondary terminal group are placed symmetrically to each other with respect to the center line between the primary terminal forming part and the secondary terminal forming part in each of the magnetic sensors. In another embodiment, the primary terminal group and the secondary terminal group may be placed asymmetrically to each other with respect to the center line between the primary terminal forming part and the secondary terminal forming part in each of the magnetic sensors. Also, the total number of the terminals of the primary terminal group may be different from the total number of the terminals of the secondary terminal group.

In the above embodiment, the magnetic sensor is of a small outline package (SOP) type that is a package, in which the terminals are formed at two opposite sides of the encapsulating portion. In another embodiment, the terminals may be formed in at least one of the wire side end part and the opening side end part of the encapsulating portion. In a case where the magnetic sensor is of a quad flat package (QFP) type that is a package, in which the terminals are formed at each of four sides of a square encapsulating portion, a circuit board may have holes, which do not open at the outer edges of the circuit board, in place of the cutouts. In such a case, the magnetic collecting portions may be placed in these holes of the circuit board.

In the above embodiment, the magnetic sensor is surface mounted to the circuit board through the reflow process. In another embodiment, the mounting method for mounting the magnetic sensors to the circuit board is not limited to the reflow process. That is, the magnetic sensors may be mounted to the circuit board by any other suitable method.

In the above embodiment, the two magnetic sensing elements are provided to each of the magnetic sensors. In another embodiment, the total number of the magnetic sensing elements in each magnetic sensor may be any number, such as one or three or more.

(II) Magnetic Collector Module

In the above embodiment, the sensor unit is applied to the magnetic collector module. In another embodiment, the structure of the magnetic collector module is not limited to the above described example and may be constructed in any manner. Furthermore, the sensor unit may be applied to any other apparatus, which is other than the magnetic collector module.

In the above embodiment, the magnetic sensor module is applied to the torque sensor. In another embodiment, the magnetic collector module may be applied to another type of apparatus, which is other than the torque sensor.

The present disclosure is not limited to the above embodiments and modifications thereof. That is, the above embodiments and modifications thereof may be modified in various ways without departing from the spirit and scope of the present disclosure.

What is claimed is:

1. A sensor unit comprising:
a plurality of magnetic sensors, each of which includes:
   a magnetic sensing element, which senses a magnetic field;
   an encapsulating portion, which encapsulates the magnetic sensing element;
   a primary terminal group, which includes a plurality of terminals that project from a primary terminal forming part of the encapsulating portion, wherein the primary terminal forming part is one side of the encapsulating portion; and
   a secondary terminal group, which includes a plurality of terminals that project from a secondary terminal forming part of the encapsulating portion, wherein the secondary terminal forming part is an opposite side of the encapsulating portion, which is opposite from the primary terminal forming part of the encapsulating portion about a center line centered between the primary terminal forming part and the secondary terminal forming part; and
a circuit board that has a common surface, to which the plurality of magnetic sensors is mounted, wherein:
among the plurality of magnetic sensors, two adjacent magnetic sensors, which are oriented in a common direction and arranged side by side such that the two adjacent magnetic sensors are placed one after another in a perpendicular direction, which is perpendicular to the center line of each of the two adjacent magnetic sensors and is parallel to a plane of the common surface of the circuit board, and the secondary terminal group of one of the two adjacent magnetic sensors is directly opposed to the primary terminal group of another one of the two adjacent magnetic sensors in the perpendicular direction;
the plurality of terminals of the primary terminal group of each of the plurality of magnetic sensors includes a primary output terminal configured to output an output signal generated based on a measurement value of the magnetic sensing element of the respective magnetic sensor;
the plurality of terminals of the secondary terminal group of each of the plurality of magnetic sensors includes a secondary output terminal configured to output the output signal such that both the primary and secondary output terminals output the output signal of that respective magnetic sensor; and
the primary output terminal and the secondary output terminal are placed asymmetrically to each other with respect to the center line centered between the primary terminal forming part and the secondary terminal forming part in each of the plurality of magnetic sensors.

2. The sensor unit according to claim 1, wherein:
each of the plurality of magnetic sensors includes a computing unit that outputs the output signal of that respective magnetic sensor; and
wherein the output signal of each of the plurality of magnetic sensors is one of a main signal and a sub signal, wherein one of the main signal and the sub signal is positive relative to a reference value, and the other one of the main signal and the sub signal is negative relative to the reference value.

3. The sensor unit according to claim 2, wherein a corresponding one of the two adjacent magnetic sensors outputs the main signal, and the other one of the two adjacent magnetic sensors outputs the sub signal.

4. The sensor unit according to claim 1, comprising at least one capacitor that is mounted to the common surface of the circuit board, to which the plurality of magnetic sensors is mounted, wherein the at least one capacitor is placed at an outside of a sensor area on the common surface of the circuit board in which the plurality of magnetic sensors is mounted.

5. The sensor unit according to claim 1, wherein:
the plurality of terminals of the primary terminal group of each of the plurality of magnetic sensors includes a primary power supply terminal and a primary ground terminal;
the plurality of terminals of the secondary terminal group of each of the plurality of magnetic sensors includes a secondary power supply terminal and a secondary ground terminal;
the primary output terminal, the primary ground terminal and the primary power supply terminal are arranged one after another in this order in each of the plurality of magnetic sensors; and
the secondary output terminal, the secondary ground terminal and the secondary power supply terminal are arranged one after another in this order in each of the plurality of magnetic sensors.

6. A magnetic collector module comprising:
the sensor unit of claim 1;
a pair of magnetic collecting rings, each of which includes one or more magnetic collecting portions, wherein each of the plurality of magnetic sensors is held between a corresponding one of the one or more magnetic collecting portions of one of the pair of magnetic collecting rings and a corresponding one of the one or more magnetic collecting portions of another one of the pair of magnetic collecting rings;
a shield member that shields the sensor unit from magnetism applied from an outside; and
a holding member that holds the pair of magnetic collecting rings and the sensor unit.

7. The sensor unit according to claim 1, wherein the output signal, which is outputted from the primary output terminal and the secondary output terminal of the one of the two adjacent magnetic sensors, is one of a positive signal and a negative signal relative to a reference value, and the output signal, which is outputted from the primary output terminal and the secondary output terminal of the another one of the two adjacent magnetic sensors, is another one of the positive signal and the negative signal.

8. The sensor unit according to claim 1, wherein each of the plurality of magnetic sensors is identical such that the plurality of terminals of the primary and secondary terminal groups is identically positioned on each of the plurality of magnetic sensors.

* * * * *